(12) United States Patent
Sugawara et al.

(10) Patent No.: US 10,411,203 B2
(45) Date of Patent: Sep. 10, 2019

(54) ORGANIC ELECTROLUMINESCENT ELEMENT, AND LIGHTING DEVICE AND DISPLAY DEVICE EACH USING SAME

(71) Applicant: Konica Minolta, Inc., Tokyo (JP)

(72) Inventors: Ryutaro Sugawara, Machida (JP); Takamune Hattori, Hachioji (JP); Hiroshi Kita, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/112,460

(22) PCT Filed: Jan. 28, 2015

(86) PCT No.: PCT/JP2015/052271
§ 371 (c)(1),
(2) Date: Jul. 19, 2016

(87) PCT Pub. No.: WO2015/125571
PCT Pub. Date: Aug. 27, 2015

(65) Prior Publication Data
US 2016/0336522 A1 Nov. 17, 2016

(30) Foreign Application Priority Data

Feb. 21, 2014 (JP) .................. 2014-031547

(51) Int. Cl.
*H01L 51/00* (2006.01)
*C09K 11/06* (2006.01)
(Continued)

(52) U.S. Cl.
CPC ........ *H01L 51/0094* (2013.01); *C09K 11/025* (2013.01); *C09K 11/06* (2013.01);
(Continued)

(58) Field of Classification Search
CPC .................. C09K 11/025; C09K 11/06; C09K 2211/1007; C09K 2211/1011;
(Continued)

(56) References Cited

U.S. PATENT DOCUMENTS

| 2004/0076853 | A1* | 4/2004 | Jarikov | .................. C09K 11/06 428/690 |
| 2004/0124766 | A1* | 7/2004 | Nakagawa | .......... H01L 51/0064 313/504 |
| 2016/0372683 | A1* | 12/2016 | Tanimoto | ............ H01L 51/0067 |

FOREIGN PATENT DOCUMENTS

| JP | 2004-014219 A | * | 1/2004 |
| JP | 2004047329 A |   | 2/2004 |

(Continued)

OTHER PUBLICATIONS

Machine translation for JP 2004-047329A (publication date Feb. 2004). (Year: 2004).*

(Continued)

*Primary Examiner* — Dawn L Garrett
(74) *Attorney, Agent, or Firm* — Lucas & Mercanti, LLP

(57) ABSTRACT

Provided is an organic electroluminescent element containing an anode, a cathode, and an organic functional layer containing one or a plurality of light-emitting layers, the organic functional layer being interposed between the anode and the cathode, wherein at least one of the light-emitting layers contains a compound having two condensed aromatic rings bonded to each other with a linking group; and the condensed aromatic rings form a π-π stacking structure in the molecule.

19 Claims, 4 Drawing Sheets

(51) Int. Cl.
*C09K 11/02* (2006.01)
*H01L 51/50* (2006.01)

(52) U.S. Cl.
CPC ...... *H01L 51/0071* (2013.01); *H01L 51/0072* (2013.01); *H01L 51/0073* (2013.01); *H01L 51/0074* (2013.01); *C09K 2211/1007* (2013.01); *C09K 2211/1011* (2013.01); *C09K 2211/1029* (2013.01); *C09K 2211/1033* (2013.01); *C09K 2211/1044* (2013.01); *C09K 2211/1048* (2013.01); *C09K 2211/1051* (2013.01); *C09K 2211/1062* (2013.01); *C09K 2211/1077* (2013.01); *C09K 2211/1088* (2013.01); *C09K 2211/1092* (2013.01); *C09K 2211/185* (2013.01); *H01L 51/5012* (2013.01); *H01L 51/5016* (2013.01)

(58) Field of Classification Search
CPC .... C09K 2211/1029; C09K 2211/1033; C09K 2211/1044; C09K 2211/1048; C09K 2211/1051; C09K 2211/1062; C09K 2211/1077; C09K 2211/1088; C09K 2211/1092; C09K 2211/185; H01L 51/0071; H01L 51/0072; H01L 51/0073; H01L 51/0074; H01L 51/0094; H01L 51/5012; H01L 51/5016
See application file for complete search history.

(56) References Cited

FOREIGN PATENT DOCUMENTS

| | | | |
|---|---|---|---|
| JP | 2004-253298 A | * | 9/2004 |
| JP | 2012104638 A | | 5/2012 |
| JP | 2013026300 A | | 2/2013 |

OTHER PUBLICATIONS

Machine translation for JP 2012-104638A (publication date May 2012). (Year: 2012).*
Yosuke et al., Synthesis, (2004), No. 16, pp. 2743-2746. (Year: 2004).*
Shimizu et al., Bulletin of the Chemical Society of Japan, vol. 82, No. 7, pp. 860-869, (2009). (Year: 2009).*
Machine translation for JP 2004-253298 A (publication date: Sep. 2004). (Year: 2004).*
Machine translation for JP 2004-014219 A (publication date: Jan. 2004). (Year: 2004).*
International Preliminary Report on Patentability dated Jul. 4, 2015 from the corresponding International Application; International Application No. PCT/JP2015/052271; Applicant: Konica Minolta, Inc.; English translation of International Preliminary Report on Patentability; Total of 10 pages.
W. Nakanishi, et al; Synthesis of disilanyl double-pillared bisdibenzofuran . . . ; Organic Letters; vol. 14; No. 6; 2012; pp. 1636-1639.
International Search Report dated Apr. 7, 2015 for PCT/JP2015/052271 and English translation.
Office Action dated Jan. 10, 2018 from corresponding Korean Patent Application No. KR 10-2016-7022374 and English translation.
Non-Patent Literature by Yosuke Nakamura, et al., "Synthesis and Properties of N-Arylcarbazolophane-Paracyclophane Combined with Carbazoles", No. 16, 2743-2746 (2004).
Non-Patent Literature by Hideyki Shimizu, et al., "Synthesis and Photophysical Properties of N-Arylcarbaolophanes", Bull. Chem. Soc. Jpn. vol. 82, No. 7 (2009), pp. 860-869.
Office Action dated Jul. 19, 2018 from corresponding Korean Patent Application No. KR 10-2016-7022374 and English translation.
Notification of Reasons for Rejection dated Jan. 8, 2019 from corresponding Japanese Patent Application No. JP 2016-504013 and English translation.
Office Action dated Sep. 12, 2018 from corresponding Korean Patent Application No. KR 10-2016-7022374 and English translation.
Phys. Chem. Chem. Phys., 12, pp. 15410-15413 (2010), "Electroluminescence of poly(N-vinylcarbazole) films: fluorescence, phosphorescence and electromers" by Ye, et al.

* cited by examiner

ORGANIC ELECTROLUMINESCENT ELEMENT, AND LIGHTING DEVICE AND DISPLAY DEVICE EACH USING SAME

CROSS REFERENCE TO RELATED APPLICATION

This Application is a 371 of PCT/JP2015/052271 filed on Jan. 28, 2015, which, in turn, claimed the priority of Japanese Patent Application No. JP2014-031547 filed on Feb. 21, 2014, both applications are incorporated herein by reference.

TECHNICAL FILED

The present invention relates to an organic electroluminescent element achieving a small degree of voltage increase, a small degree of lifetime decrease, and a small degree of light-emission efficiency decrease during drive of the organic electroluminescent element, and the present invention relates to a lighting device and a display device provided with this organic electroluminescent element.

BACKGROUND

An organic electroluminescent element (hereafter, it is also called as an organic EL element) is a light-emitting element having a constitution in which an organic functional layer containing a luminescent organic compound is interposed between a cathode and an anode. A hole injected from an anode and an electron injected from a cathode by applying an electric field are recombined in a light-emitting layer to form an exciton. It uses light (fluorescence and phosphorescence) emitted when the above exciton is deactivated.

Organic materials used in the organic functional layer are generally insulating materials which are difficult to electrify due to the small charge mobility. However, an organic EL element can emit light by using organic materials with a thickness of about submicron with applying a voltage of several volts to several ten volts. This can be achieved by making use of the fact that when an injected charge density becomes larger than the charge density of the inside of the thin film, electrons will be passed by space-charge limited current not by ohm current. This space-charge limited current has a property to be inversely proportional to the cube of the film thickness, and to be proportional to the square of the applied voltage. Therefore, the electric current can be passed by using a thinned organic material. When a voltage is applied to a thin film having about a 100 nm, an electric current of several mA is passed. This means that an electric current can be passed through an organic material which is an insulator by making a sufficient thin film.

The charge transfer in the organic material is largely affected by the crystalline condition of the organic material. When an organic molecule is in a single crystalline state, it will be produced energy bands formed by a $\pi$-$\pi$ interaction between the molecules. As a result, the mobility of the charge becomes large and an electric current will easily flow. However, when an organic molecule is made into a thin film of submicron order, which is required for producing an organic EL element, it is very hard to make a single crystalline. Therefore, it is used an amorphous film having no order of molecular arrangement for producing an organic EL element.

A technology development of high luminescence with small power consumption is required for realization of an organic EL element employing a thin amorphous film. It was reported an organic EL element using a phosphorescent material from an excited triplet state by researchers in Princeton University: M. A. Baldo et al., Nature, Vol. 395, pp. 151 to 154 (1998). Since then, active researches have been made for the materials emitting phosphorescence at room temperature: see M. A. Baldo et al., Nature, Vol. 403, No. 17, pp. 750 to 753 (2000), and U.S. Pat. No. 6,097,147.

In an organic EL element using a phosphorescent material, it is an important technical problem to control the recombination location of the exciton, and in particular, to make recombination of the exciton inside of the light-emitting layer for improving efficiency and lifetime of the element.

In recent years, it was said that it was important to control the orientation condition of molecules and to control the electric property and the optical property of the organic EL element for the purpose of controlling the recombination location of the exciton, and in particular, to make recombination of the exciton inside of the light-emitting layer of an organic EL element using an amorphous thin film. Because it is considered that the organic molecules in the amorphous thin film change their orientation to the electric field direction at application of voltage, and the mobility of the charge and the recombination rate will be changed.

Patent document 1 (JP-A No. 2013-26300) describes a method of improving light emission efficiency of an organic EL element. The method focuses on the organic molecule contained in the light-emitting layer located between the cathode and the anode. The method arranges a molecular structure of the organic molecule so that the transition dipole moment of the organic molecule will have a direction to the molecular plane, and controls the organic molecule to be the electric field direction (the vertical direction to the both electrodes) to which organic molecule is orientated during application of voltage. By this, all energy of the excited organic molecule will be converted to the visible light without being consumed for non-light-emitting recombination other than surface plasmon polariton excitation. However, since the organic molecules are mutually affected with the transition dipole moment during application of voltage, the organic molecules will form aggregation. Therefore, it is difficult to control the orientation change of the molecule during application of voltage.

PRIOR ART

Patent Document

Patent document 1: JP-A No. 2013-26300

SUMMARY OF THE INVENTION

Problems to be Solved by the Invention

As a result of extensive investigation of the present inventors, it has become revealed the following. An organic molecule in an organic EL element using a phosphorescent material will change its orientation condition of the molecules due to the morphology (form) change at the time of application of voltage to the organic EL element. This morphology change will cause the decrease of performance of the organic EL element.

The reason of the decrease of performance of the organic EL element is supposed to be as follows. When the morphology of the light-emitting layer changes during application of the voltage, it will induce not only change of recombination rate but also the change of recombination location. As a result, it is assumed that emission efficiency will be decreased.

A light-emitting layer of an organic EL element contains an emission material dispersed in a large amount of host material in order to avoid occurring concentration quenching. Consequently, the performance of the organic EL element can be improved by suppressing the morphology change of the host compound that occupies the most part of the light-emitting layer as much as possible during application of voltage.

Further, it has been revealed the factor of the morphology change in the light-emitting layer. The host material molecules are aggregated by receiving the outer stimulus of the electric field, and they form a molecular aggregate from the condition of being in a single molecule.

Examples of such a molecular aggregate are: an excimer and an exciplex, in addition to an aggregate in a ground state. The excimer is a dimer (an excited dimer) in an excited state. It exists only in an excited state. The excimer is a dimer of the same molecule. On the other hand, the exciplex is a dimer of molecules of different types. The excimer is produced through formation of a charge transfer complex between the molecule in a ground state with molecule in an excited state. Therefore, it is known that the amount of produced excimer is proportional to the density of the molecule. It may be said that, in a thin film in which an organic molecule exists in a high density, the excited state molecules produced by recombination will easily form an excimer or an exciplex.

The excimer or the exciplex will form a structure of superposing condensed aromatic rings. It was found by the present inventors that this kind of aggregate will not form aggregates by further associating with an intermolecular interaction. This is explained by the excimer, for example. The excimer is regarded as a dimer formed with an electrodonating molecule in an excited state and an electron-accepting molecule in a ground state. This dimer has a charge bias due to overlap of the orbitals of the molecules. As a result, a repulsion force is produced between other excited dimer. Consequently, it is thought that it will not be further produced an aggregate.

The excimer or the exciplex may be produced not only through an intermolecular interaction but an intramolecular interaction when condensed aromatic rings are located near with each other in the molecule. In the organic molecules having been formed an excited dimer in the molecule, a repulsion force is produced between other excited dimer in the molecule, similarly to the excimer or the exciplex formed with an intermolecular force. Consequently, it was found that a molecular aggregate will not be produced.

Consequently, an object of the present invention is to provide an organic electroluminescent element achieving a small degree of voltage increase, a small degree of lifetime decrease and a small degree of light-emission efficiency decrease of the element by suppressing the morphology change of the host compound during application of voltage. Another object of the present invention is to provide a lighting device and a display device provided with this organic electroluminescent element.

Means to Solve the Problems

In order to solve the above-described problems, the following embodiments were used.

1. An organic electroluminescent element comprising an anode, a cathode, and an organic functional layer containing one or a plurality of light-emitting layers, the organic functional layer being interposed between the anode and the cathode, wherein at least one of the light-emitting layers contains a compound having condensed aromatic rings bonded with a linking group; and the condensed aromatic rings form a π-π stacking structure in the molecule.

2. The organic electroluminescent element described in the embodiment 1, wherein the compound having a π-π stacking structure with the condensed aromatic rings forms an intramolecular excimer or an intramolecular exciplex.

3. The organic electroluminescent element described in the embodiments 1 or 2, wherein the condensed aromatic rings are bonded to each other with two or more linking groups.

4. The organic electroluminescent element described in any one of the embodiments 1 to 3, wherein the condensed aromatic rings are bonded to each other with three or more linking groups.

5. The organic electroluminescent element described in any one of the embodiments 1 to 4, wherein the condensed aromatic rings each have the same skeleton.

6. The organic electroluminescent element described in any one of the embodiments 1 to 5, wherein two of the condensed aromatic rings having the same skeleton each have the linking group at the same position of the skeleton.

7. The organic electroluminescent element described in any one of the embodiments 1 to 6, wherein the condensed aromatic rings each have a plurality of aromatic rings; and two or more of the aromatic rings each have the linking group.

8. The organic electroluminescent element described in any one of the embodiments 3 to 7, wherein two or more of the linking groups are the same linking group.

9. The organic electroluminescent element described in any one of the embodiments 3 to 8, wherein among linking chains of the linking groups bonding the two condensed aromatic rings, when a number of atoms in the linking chain of the linking group having the least number of atoms is defined as "n", "n" is an integer of 3 to 5 in the linking group bonding the two condensed aromatic rings.

10. A display device having the organic electroluminescent element described in any one of the embodiments 1 to 9.

11. A lighting device having the organic electroluminescent element described in any one of the embodiments 1 to 9.

Effects of the Invention

By using the above-described embodiments, it can provide an organic electroluminescent element achieving a small degree of voltage increase, lifetime decrease and light-emission efficiency decrease during drive of the organic electroluminescent element by suppressing the morphology change of the host compound during application of voltage. In addition, it can provide a lighting device and a display device provided with this organic electroluminescent element.

EMBODIMENTS TO CARRY OUT THE INVENTION

Figure 1A:
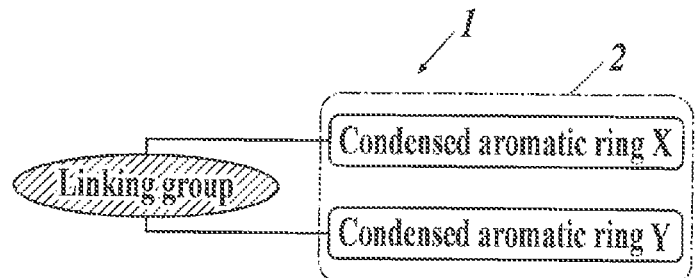
FIG. 1A is a schematic drawing of a compound having two condensed aromatic rings bonded with a linking group in the molecule.

An organic electroluminescent element of the present invention has an anode, a cathode, and an organic functional layer containing one or a plurality of light-emitting layers, the organic functional layer being interposed between the anode and the cathode, wherein at least one of the light-emitting layers contains a compound having condensed aromatic rings bonded with a linking group; and the condensed aromatic rings form a π-π stacking structure in the molecule. The above-described features are technical features commonly owned by the invention relating to the embodiments 1 to 11.

The present invention and the constitution elements thereof, as well as configurations and embodiments, will be detailed in the following. In the present description, when two figures are used to indicate a range of value before and after "to", these figures are included in the range as a lowest limit value and an upper limit value.

<π-π Stacking Structure>

A π-π stacking structure designates a structure in which plural aromatic rings are stabilized by attraction worked on the aromatic rings (π-π interaction). The strength of π-π interaction is increased as the overlap of the aromatic rings is increased. In order to form a π-π stacking structure of condensed aromatic rings in the molecule, it is required an overlap of the condensed aromatic rings having 10 π electrons or more. An overlap way of the π-π stacking structure of the present invention is not limited in particular, as long as the resulted overlap will produce an excimer or an exciplex. A preferable state is that: at least one of the condensed aromatic rings that form the π-π stacking structure overlaps its 50% or more of the π plane to the π plane of other condensed aromatic ring, the overlap being confirmed with a DFT calculation method. A more preferable state is that: two condensed aromatic rings each overlaps 50% or more of the π planes.

<Intramolecular Excimer and Intramolecular Exciplex>

An intramolecular excimer and an intramolecular exciplex will be described in the following.

An excimer and an exciplex are an excited dimer produced by aggregation of an excited molecule with a ground state molecule. When an excited dimer is composed of two same molecules, it is called as an excimer. When an excited dimer is composed of two different molecules, it is called as an exciplex. The above-described excimer and exciplex are produced by an interaction of two molecules. On the other hand, an intramolecular excimer of the present invention is produced by an interaction of the same condensed aromatic rings in the same molecule, and an intramolecular exciplex of the present invention is produced by an interaction of the different condensed aromatic rings in the same molecule.

<Compound that Forms Intramolecular Excimer or Intramolecular Exciplex>

An intramolecular excimer and an intramolecular exciplex are formed by the presence of two condensed aromatic rings in the molecule each located in a distance where a π-π interaction operates on the condensed aromatic rings. A compound of the present invention having a π-π stacking structure of the condensed aromatic rings in the molecule will form: an intramolecular excimer during application of voltage when the two condensed aromatic rings are bonded with a linking group and a condensed aromatic ring X and a condensed aromatic ring Y are the same; and an intramolecular exciplex when the condensed aromatic ring X and the condensed aromatic ring Y are different. The π-π stacking structure will be easily formed when the condensed aromatic rings are respectively a plane.

Figure 1B:
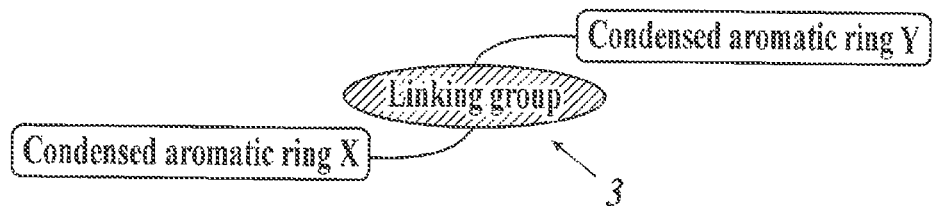
FIG. 1B is a schematic drawing of a compound having two condensed aromatic rings bonded with a linking group in the molecule.

FIG. 1A and FIG. 1B illustrate a schematic drawing of a compound having two condensed aromatic rings bonded with a linking group in the molecule. FIG. 1A is a schematic drawing of a compound having two condensed aromatic rings bonded with a linking group in the molecule in a cis-position. FIG. 1B is a schematic drawing of a compound having two condensed aromatic rings bonded with a linking group in the molecule in a trans-position. For example, a compound bonded with a disilane linking group will form compounds illustrated both in FIG. 1A and FIG. 1B. The compound indicated in FIG. 1A is a compound 1 having a π-π stacking structure 2 between the two condensed aromatic rings. An intramolecular exciplex will be formed during application of voltage. On the other hand, the compound 3 indicated in FIG. 1B has condensed aromatic rings bonded with a linking group in a trans-position. The compound 3 does not have an overlap between the two condensed aromatic rings. Therefore, an electronic excitation will not be taken place during electric filed excitation. As a result, an intramolecular exciplex will not be formed.

In order to form an excited dimer, it is required that the compound has a π-π stacking structure of the condensed aromatic rings in the molecule. That is, it is required that the compound has an overlap of the condensed aromatic rings having 10 π electrons or more in the molecule.

Figure 2:
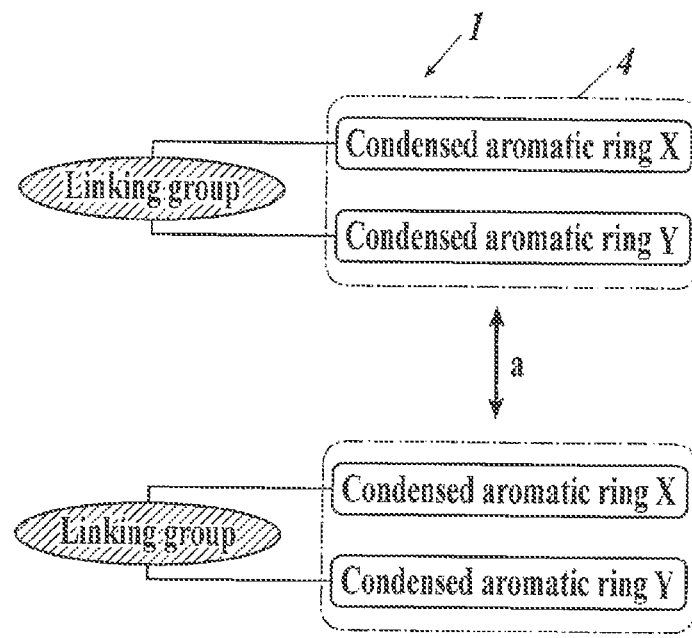
FIG. 2 is a schematic drawing illustrating an intermolecular interaction of a compound having a π-π stacking structure in the molecule during application of voltage.

FIG. 2 is a schematic drawing illustrating an intermolecular interaction of a compound having a π-π stacking structure in the molecule during application of voltage. In the compound 1 having formed an intramolecular excimer or an intramolecular exciplex 4 by application of voltage, a spatial electronic excitation has been already taken place in the molecule. Consequently, the compound 1 will have no effect of producing an electronic excitation between the adjacent molecule. It will not form an excimer or an exciplex between other molecule. As describe above, by having a π-π stacking structure in the molecule, the intermolecular interaction as indicated by a double-headed arrow will be restrained. This leads to restrain of formation of an intermolecular excimer or exciplex, and it can control a morphology change during application of voltage.

Figure 3:
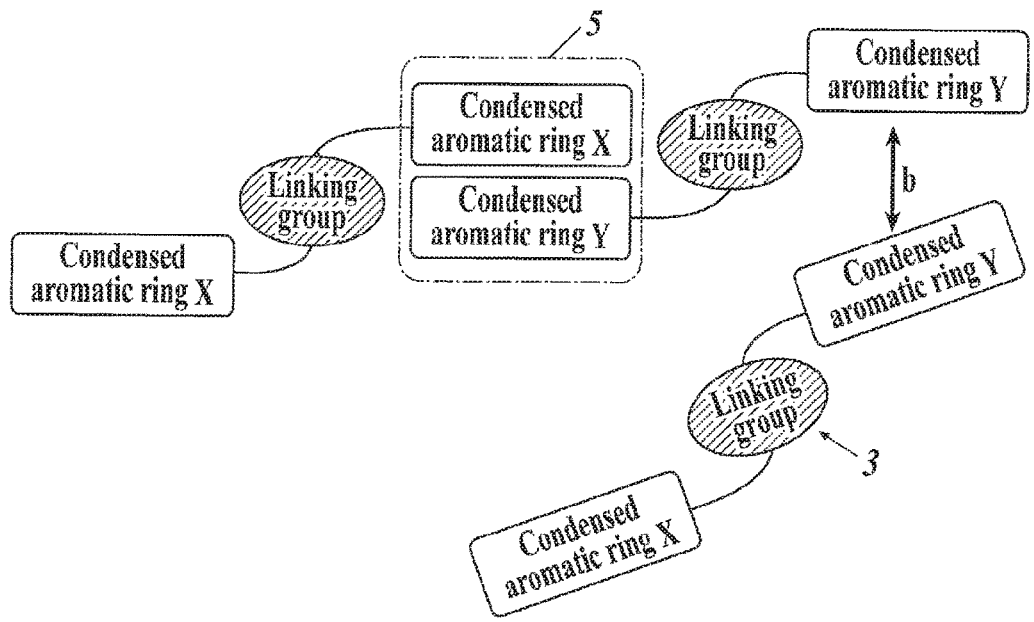
FIG. 3 is a schematic drawing illustrating an intermolecular interaction of a compound having condensed aromatic rings bonded in a trans-position in the molecule during application of voltage.

FIG. 3 is a schematic drawing illustrating an intermolecular interaction of a compound having condensed aromatic rings bonded in a trans-position in the molecule as indicated in FIG. 1B. The compound 3 having condensed aromatic rings bonded with a linking group in a trans-position will not produce an intermolecular interaction b as indicated by a double-headed arrow when the orientation of the molecules is one as illustrated in FIG. 3. Therefore, it is difficult to control the orientation of molecules so as to obtain a plane of the condensed aromatic rings. When an electric filed excitation is applied, although it may not be produced an intermolecular excimer or exciplex, it will partially form an intermolecular exciplex 5 with an adjacent molecule. As a result, the compound having condensed aromatic rings bonded with a linking group in a trans-position will change the molecular orientation when an electric filed excitation is applied. Consequently, in order to restrain the morphology change during application of voltage, it is preferable to use a compound having condensed aromatic rings bonded with a linking group in a cis-position. This compound will forma π-π stacking structure in the molecule, and it enables to restrain the formation of an intermolecular excimer or exciplex.

In the compound having condensed aromatic rings bonded with a linking group in a cis-position in the molecule, it is preferable that the compound has a plurality of linking groups from the viewpoint of obtaining a plane of the condensed aromatic rings with each other. Preferably, the compound has two linking groups, and more preferably, it has three or more linking groups.

<Skeleton of Condensed Aromatic Ring>

The ring skeleton of the present invention will be described. In the present invention, the skeleton of the ring indicates a ring member number when an aromatic hydrocarbon ring or an aromatic heterocyclic ring (hereafter, an aromatic hydrocarbon ring and an aromatic heterocyclic ring each are called as an aromatic ring) is a single ring. When the ring is a condensed ring, the skeleton of the ring indicates both a ring member number of each ring and the condensed ring structure. Therefore, when one is an aromatic hydrocarbon ring and the other is an aromatic heterocyclic ring, these two rings are considered to be the same skeleton if the ring member number of the aromatic ring and the condensed ring structure are the same.

For example, the following compounds (α-1), (α-2), and (α-3) each have a different group of atoms to form an aromatic ring. However, these form a 5-membered ring. Therefore, they are considered to be the same skeleton.

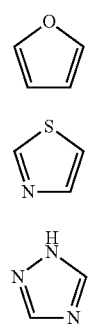

(α-1)

(α-2)

(α-3)

In the case of condensed rings, for example, the following compounds (α-4) and (α-5) each have a condensed ring composed of one 5-membered ring and two 6-membered rings. Further, the structures of the condensed ring of the two compounds are the same. Therefore, they are considered to be the same skeleton.

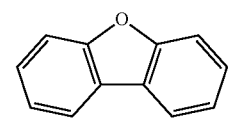

(α-4)

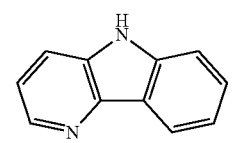

(α-5)

On the other hand, the following compounds (α-6), (α-7), and (α-8) each have condensed aromatic ring composed of a 5-membered-6-membered-5-membered ring. However, the compound (α-8) has a different condensed structure from the compounds (α-6) and (α-7). Therefore, the compound (α-8) has a different skeleton from others.

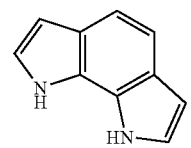

(α-6)

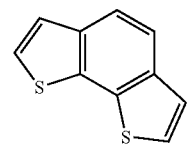

(α-7)

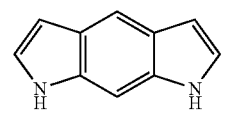

(α-8)

The reason of deciding the ring skeleton in the present invention as described above is based on the following. In the present invention, in order to produce an intramolecular excimer or an intramolecular exciplex in the molecule, the way of overlap of the π-plane of the condensed rings, being derived from the steric structure, is more important than the kinds of groups of atoms that form the aromatic rings for exhibiting the required effect.

The structure of the condensed aromatic ring is not limited in particular, as long as it will produce an intramolecular excimer or an intramolecular exciplex. When the compound is used as a host compound to a blue phosphorescent dopant, the lowest excited triplet energy level ($T_1$) of the condensed aromatic ring is preferably 3.0 eV or more. Examples of a preferable ring are aromatic heterocyclic rings such as: a carbazole ring, an azacarbazole ring, a dibenzofuran ring, an azadibenzofuran ring, a dibenzothiophene ring, an azadibenzothophene ring, and an indoloindole ring.

A linking group is not limited in particular, as long as it will make two condensed aromatic rings to stand facing each other and to produce an intramolecular excimer or an intramolecular exciplex. It is preferable that the linking group contains at least one hetero atom without limiting the atom for the purpose of improving the chemical stability of the linking group.

The nearest distance of the π-planes of the condensed aromatic rings that form the π-π stacking structure is not limited in particular, as long as it is a distance to produce an excimer or an exciplex by enabling to make interaction of the aromatic rings with each other. Preferably, the nearest distance is 3.6 Å. The reason of this is as follows. In cyclophane made of two benzene rings bonded with two alkylene group, when the distance of two benzene rings is 3.6 Å or less, the highest occupied molecular orbital (HOMO) of the benzene rings are overlapped. This is considered a distance of interacting two benzene rings.

Atomic distance of two condensed aromatic rings can be obtained by a DFT calculation. A preferable linking group is as follows. Among the joint chains (they are also called as "main chains") of the linking groups bonding the two condensed aromatic rings, when a number of atoms in the joint chain of the linking group having the least number of atoms is defined as "n", it is preferable that "n" is an integer of 3 to 5 when the main chain of the linking group contains no aromatic ring. It is preferable that "n" is an integer of 3 to 13 when the main chain of the linking group contains an aromatic ring. More preferably, "n" is an integer of 3 to 11.

In the present invention, it is preferable that the two condensed aromatic rings each have a large overlap of the π-planes of the facing condensed aromatic rings from the viewpoint of producing an effect of an intermolecular excimer or an intermolecular exciplex. Consequently, it is preferable that the two condensed aromatic rings each have the same skeleton. Further, it is preferable that the linking position of the linking group that binds two condensed rings is the same position of the skeleton. The reason of this is as follows. When the facing π-planes of the two condensed ring are taken as an example, the plane symmetry position, that is, the position in which the linking position of the linking group is the same, will produce a maximum overlap.

For example, when the two condensed aromatic rings both are the above-described compound (α-4), and the positions of the linking group bonding the two compounds (α-4) are: 1-1', 2-2', 3-3', 4-4', 5-5', 6-6', 7-7', and 8-8', they are the same position of the skeleton. They are preferable.

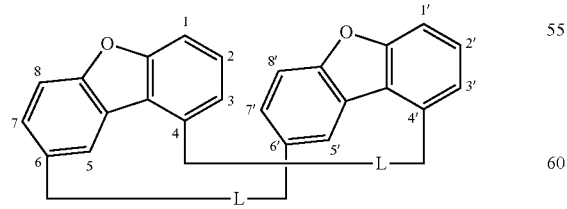

Examples of a preferable intermolecular excimer or an intermolecular exciplex used for the present invention are described. However, the present invention is not limited to them.

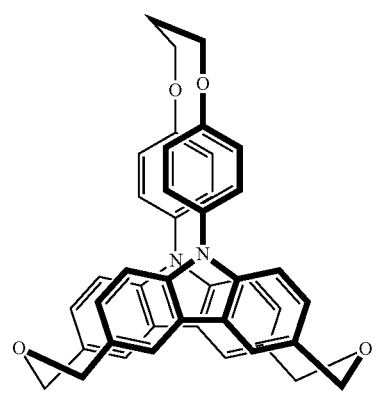

A-1

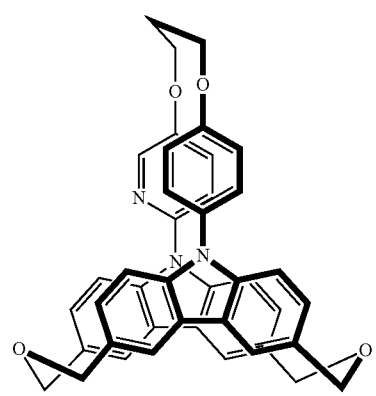

A-2

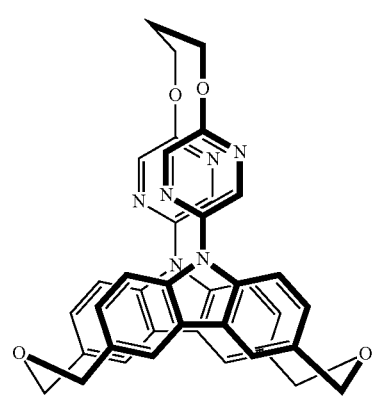

A-3

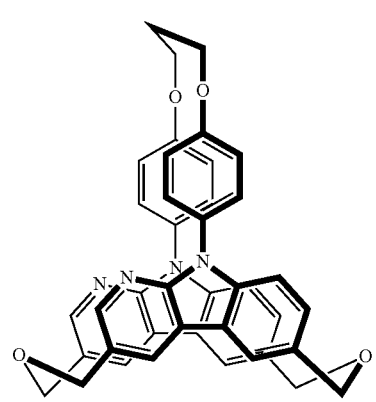

A-4

-continued
A-5
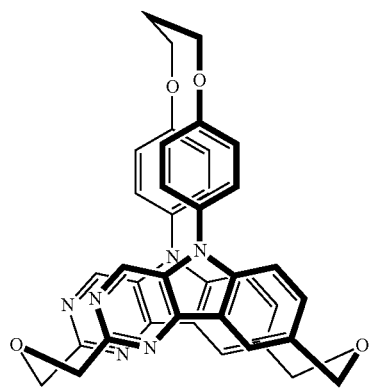
A-6
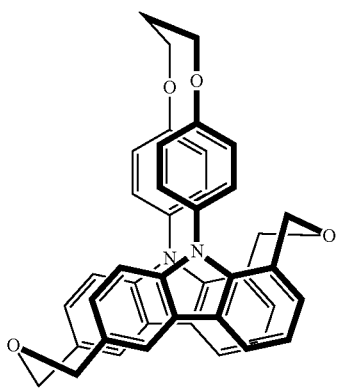
A-7
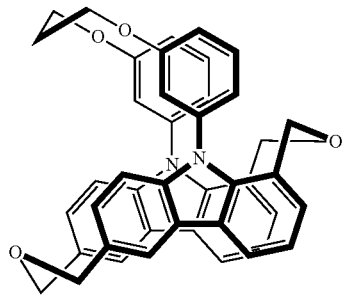
A-8
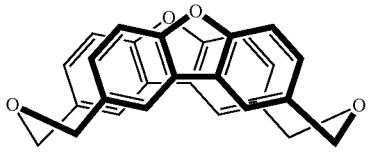
-continued
A-9
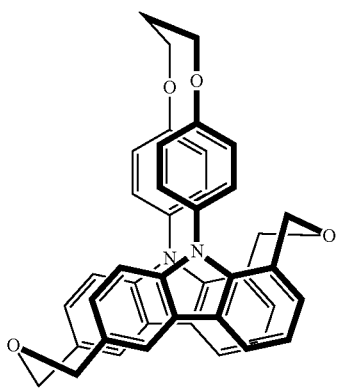
A-10
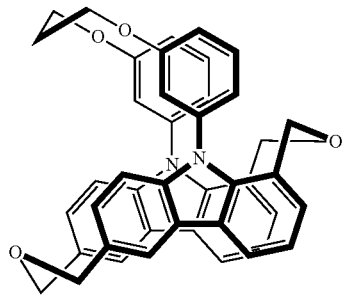
A-11
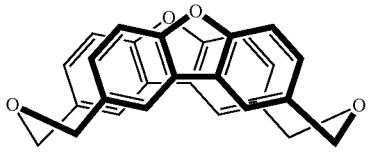
A-12
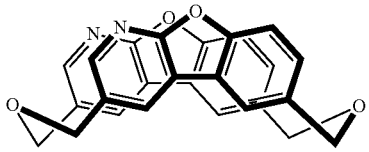
A-13
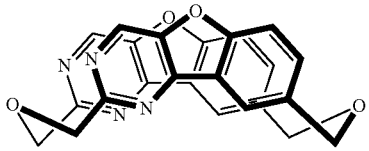
A-14
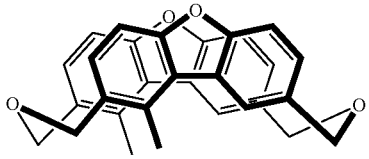
A-15
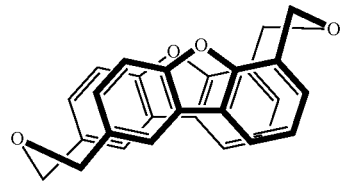

-continued
A-16
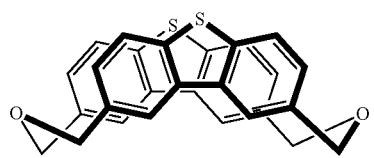
A-17
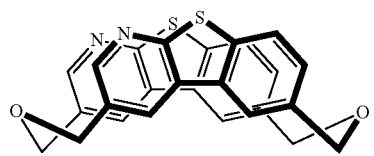
A-18
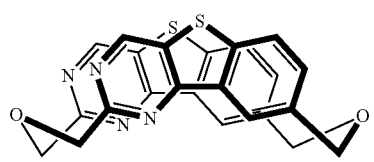
A-19
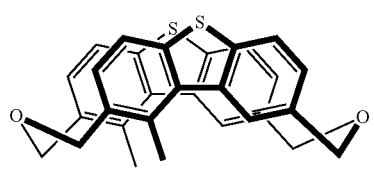
A-20
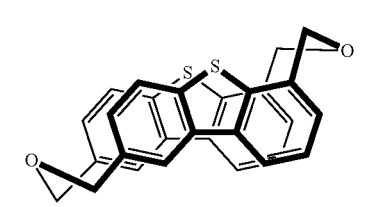
A-24
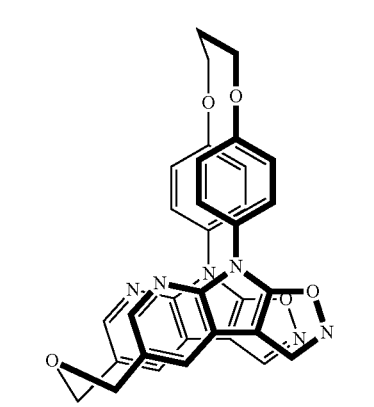
A-25
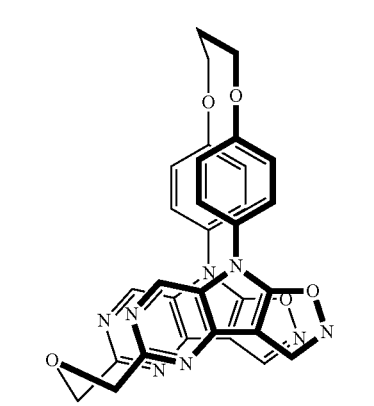
-continued
A-31
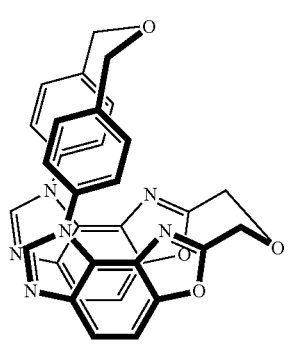
A-32
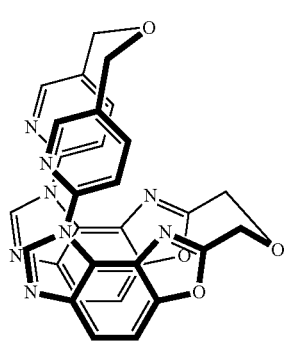
A-33
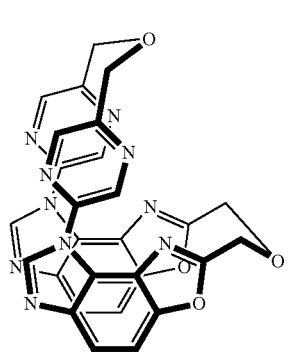
A-34
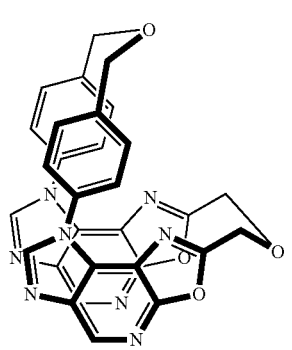

A-35
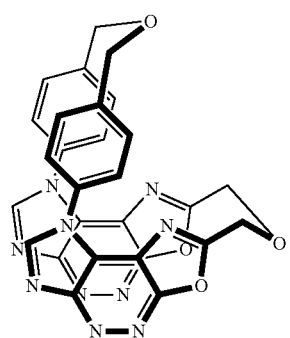
A-36
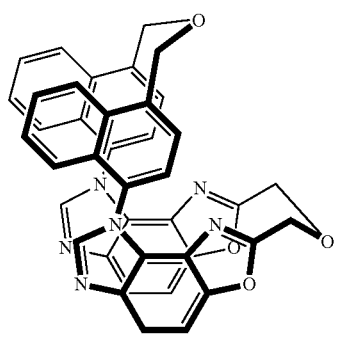
A-37
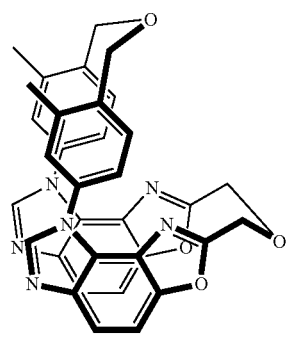
A-38
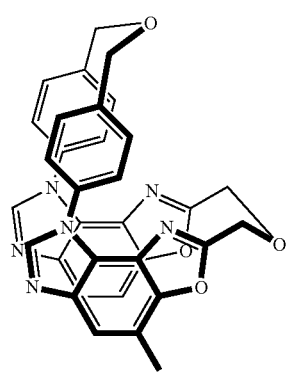
A-39
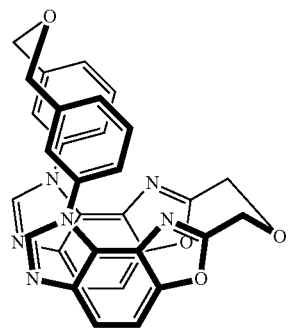
B-1
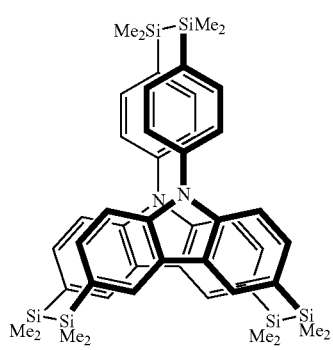
B-2
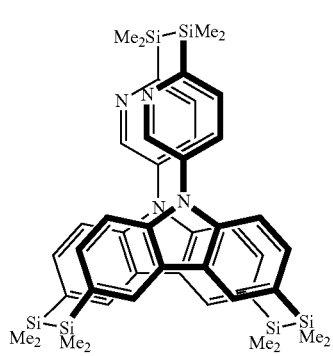
B-3
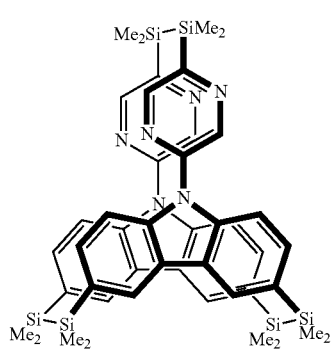

B-4
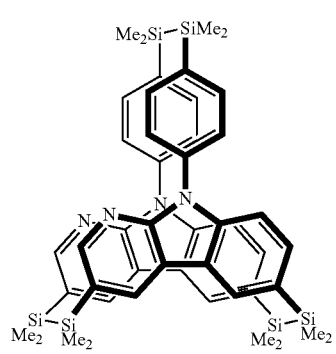
B-5
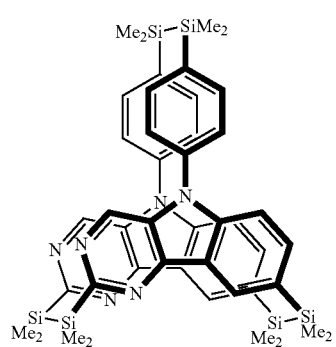
B-6
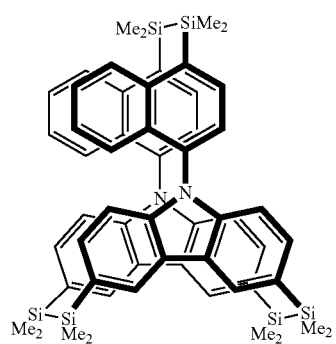
B-7
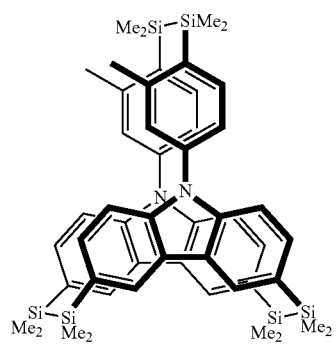
B-8
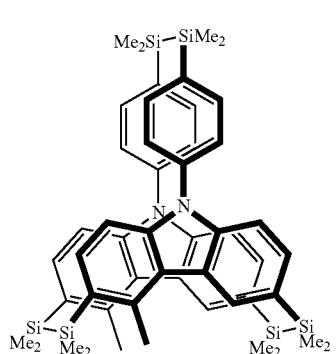
B-9
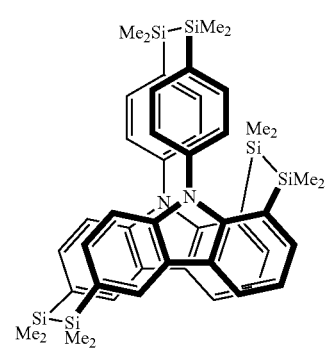
B-10
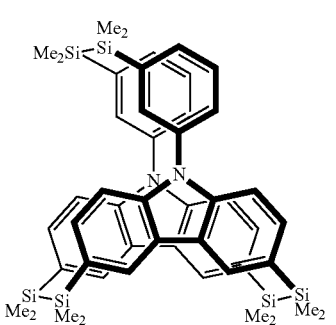
B-11
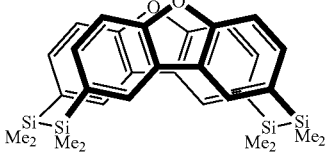
B-12
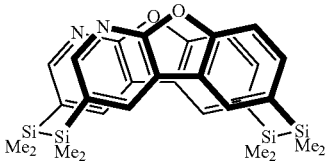
B-13
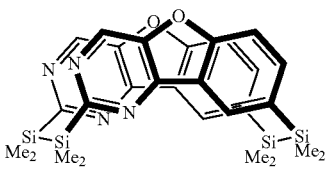

-continued
B-14
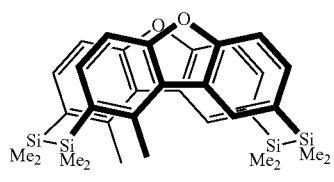
B-15
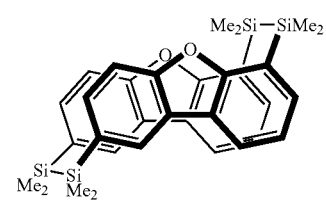
B-16
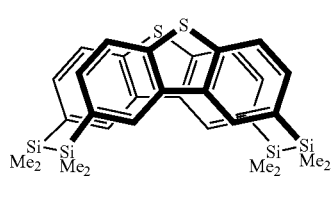
B-17
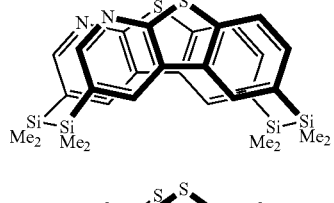
B-18
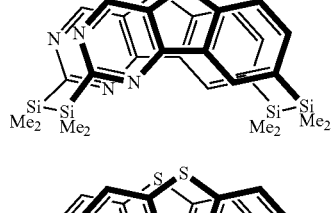
B-19
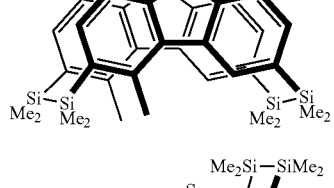
B-20
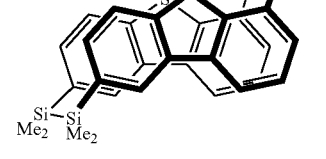
B-24
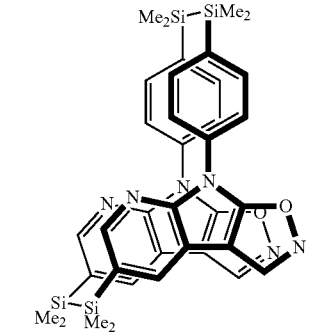
-continued
B-25
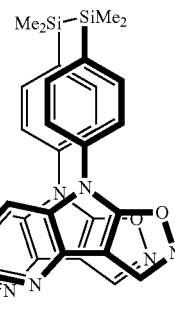
B-31
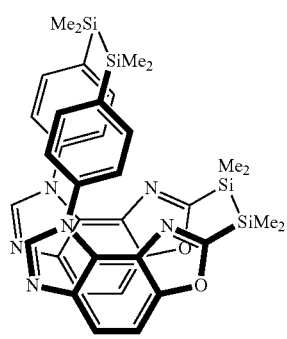
B-32
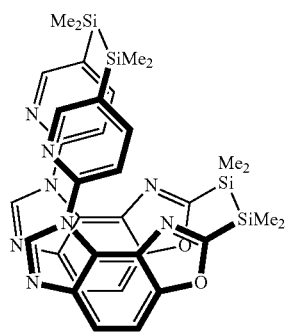
B-33
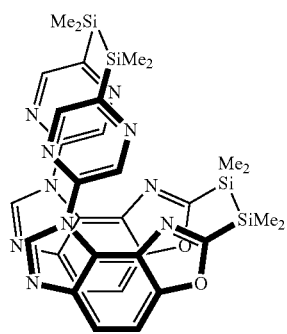

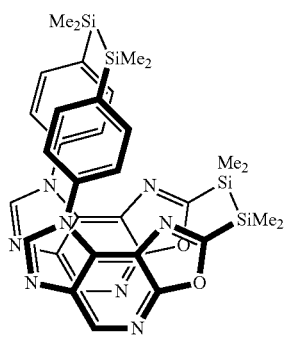
B-34
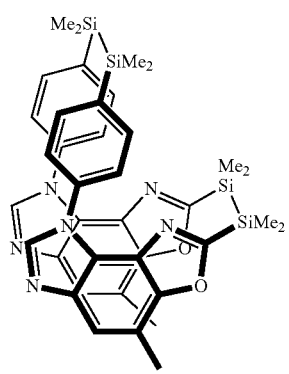
B-38
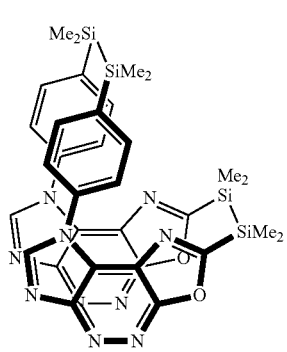
B-35
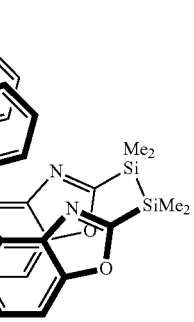
B-39
B-36
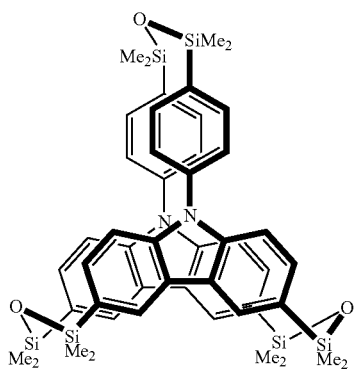
C-1
B-37
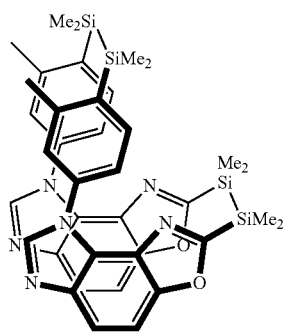
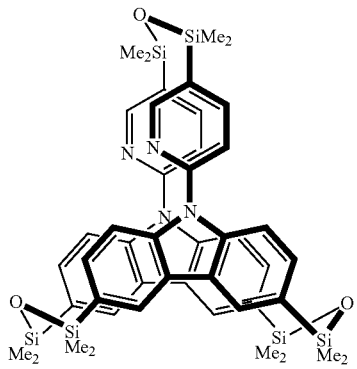
C-2

-continued
C-3
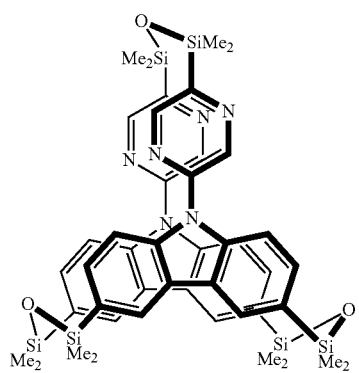
C-4
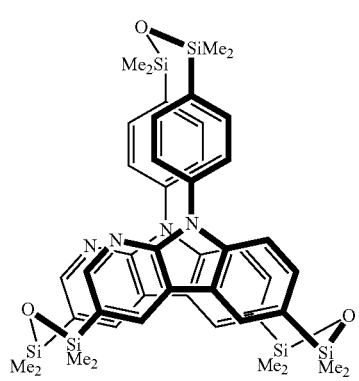
C-5
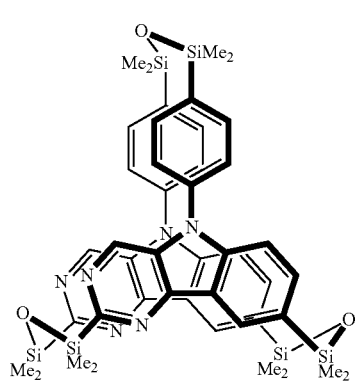
C-6
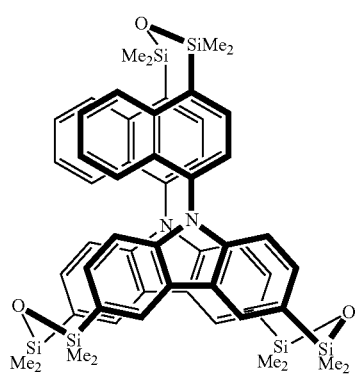
-continued
C-7
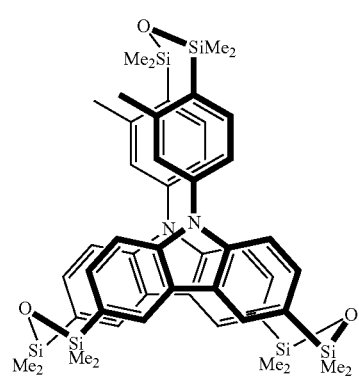
C-8
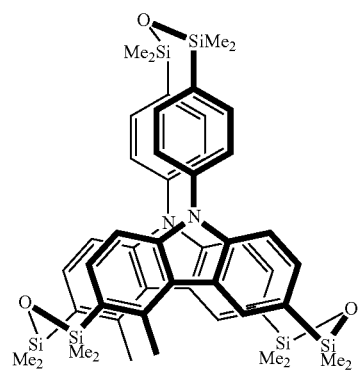
C-9
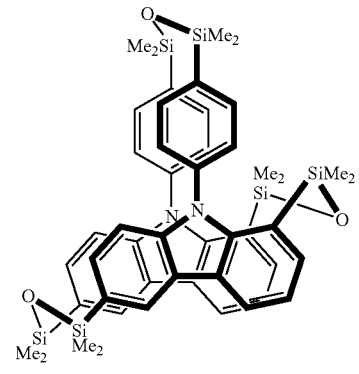
C-10
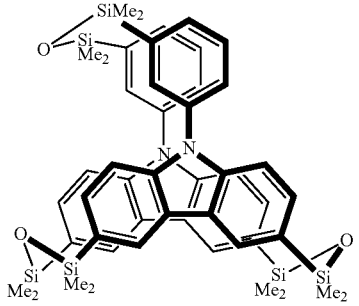
C-11
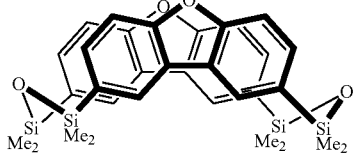

-continued
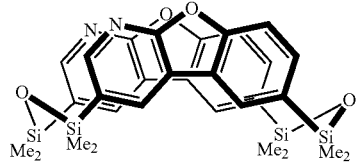
C-12
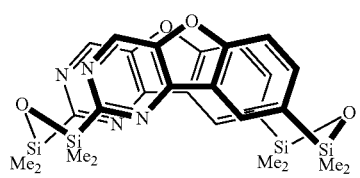
C-13
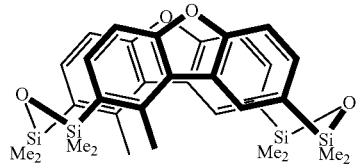
C-14
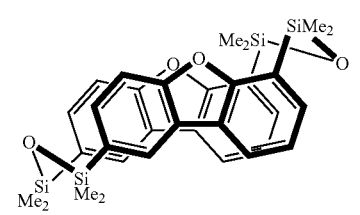
C-15
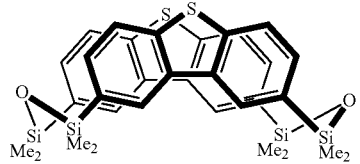
C-16
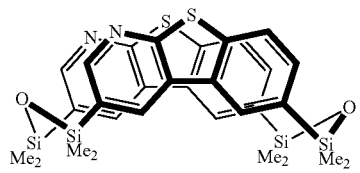
C-17
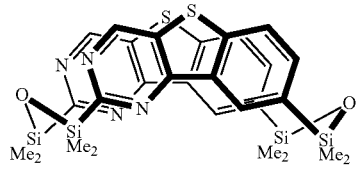
C-18
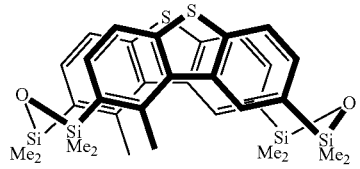
C-19
-continued
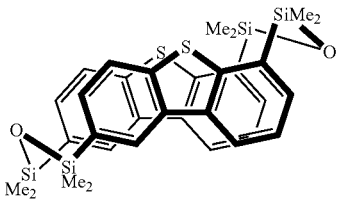
C-20
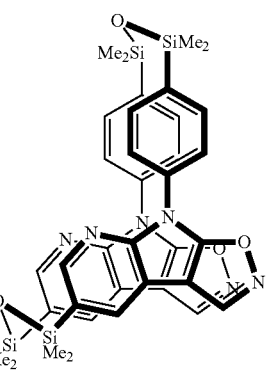
C-24
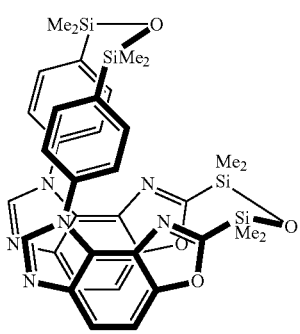
C-31
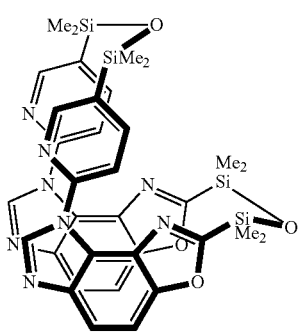
C-32
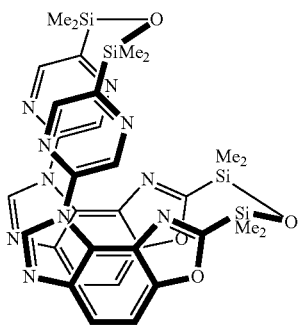
C-33

-continued
C-34
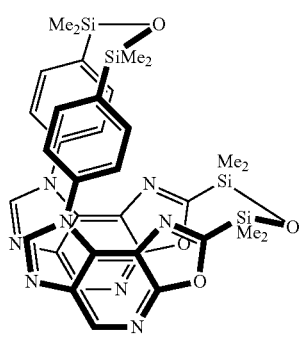
C-35
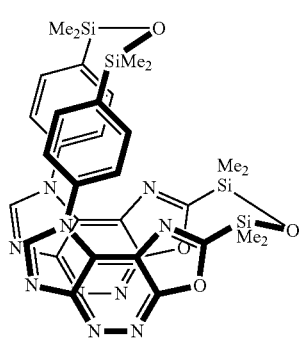
C-36
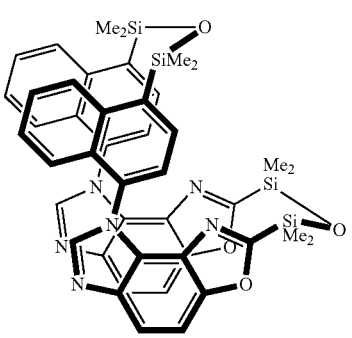
C-37
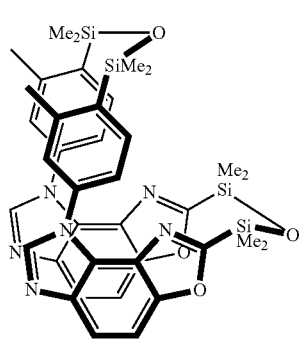
-continued
C-38
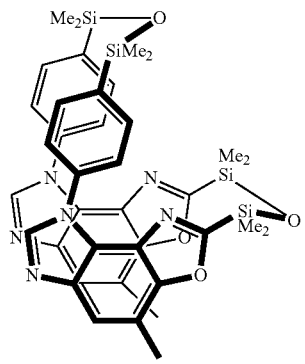
C-39
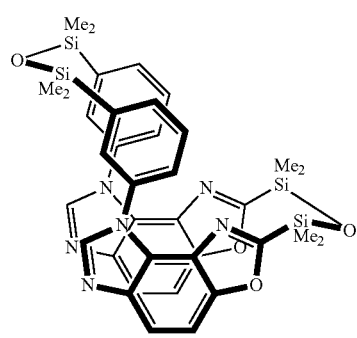
D-1
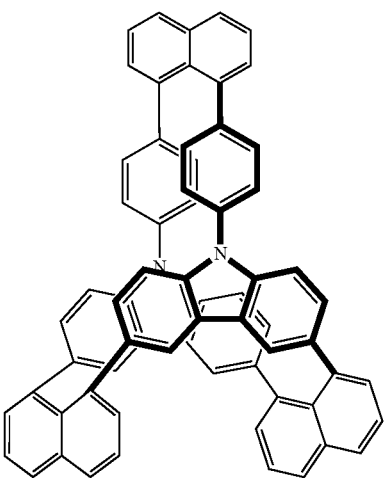
D-2
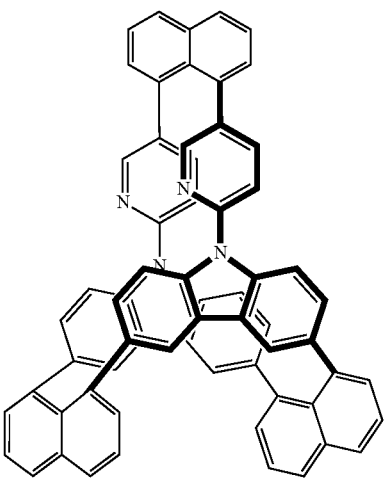

D-3
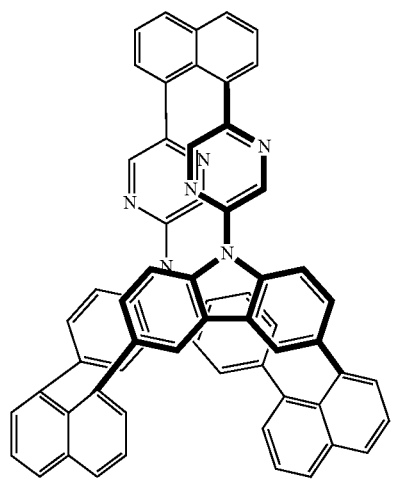
D-4
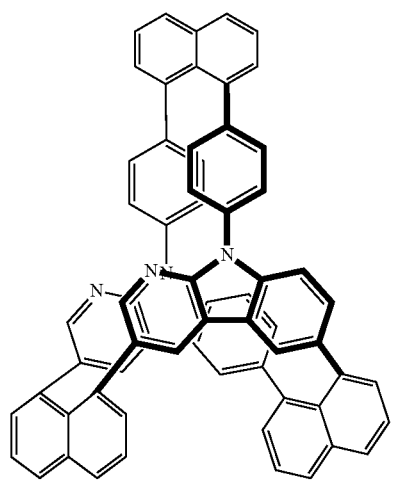
D-5
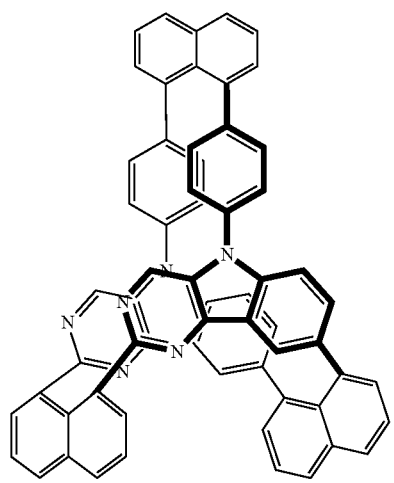
D-6
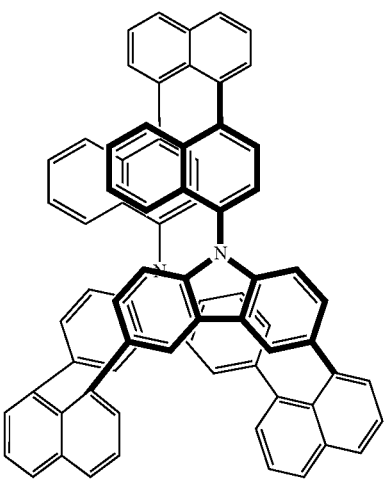
D-7
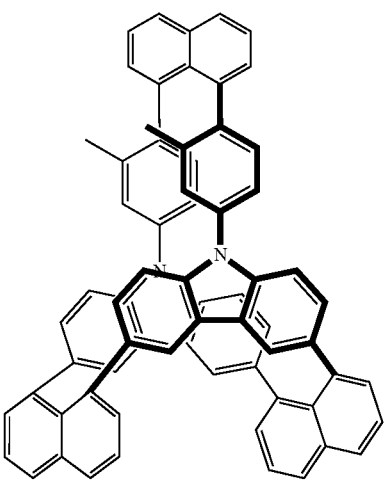
D-8
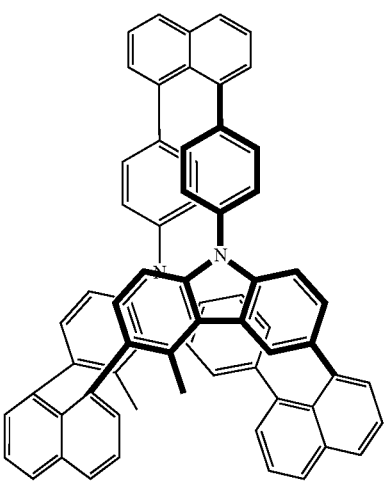

-continued
D-9
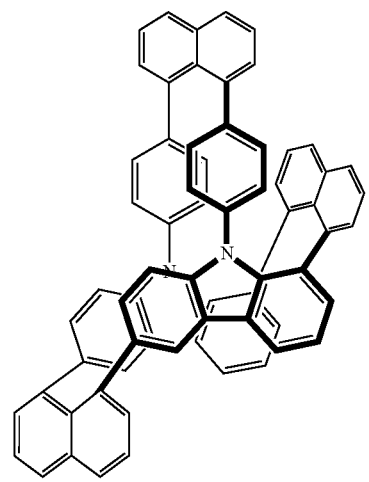
D-10
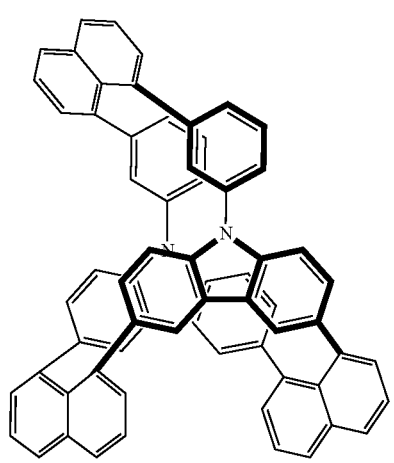
D-11
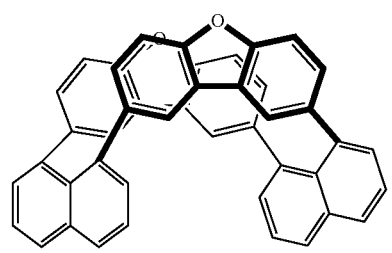
D-12
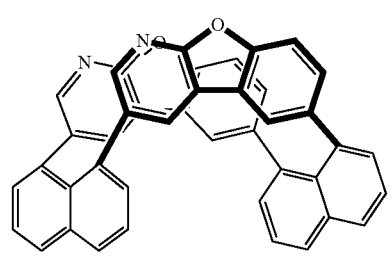
-continued
D-13
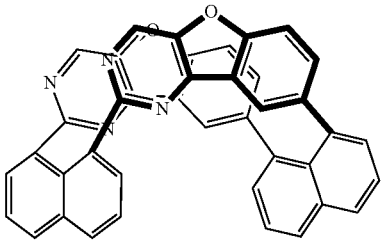
D-14
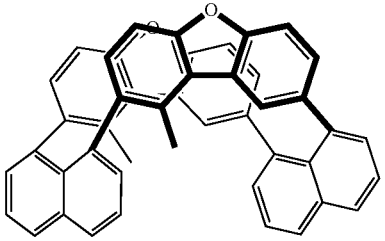
D-15
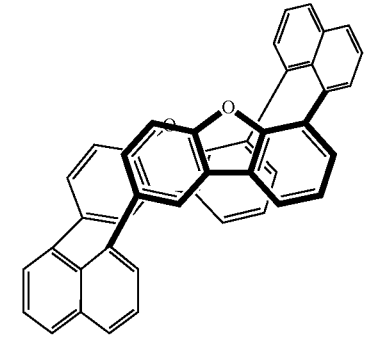
D-16
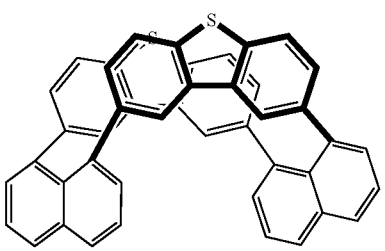
D-17
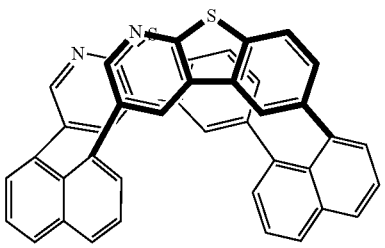
D-18
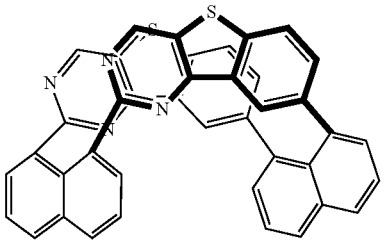

-continued
D-19
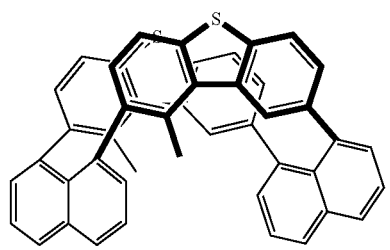
D-20
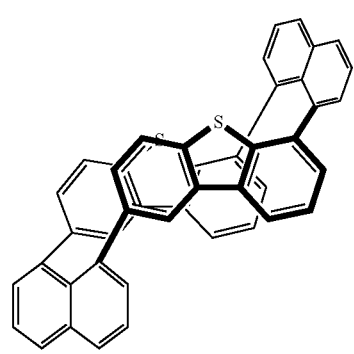
D-24
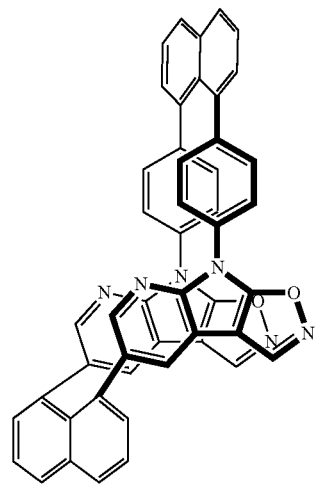
D-25
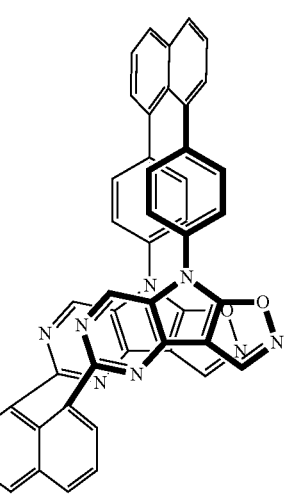
-continued
D-31
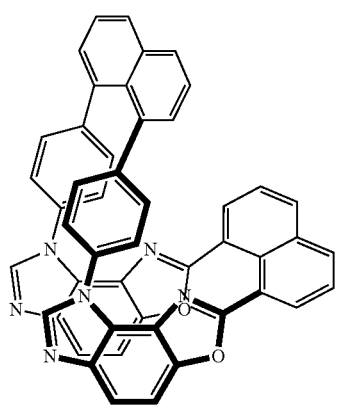
D-32
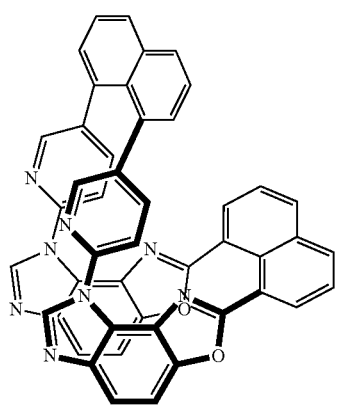
D-33
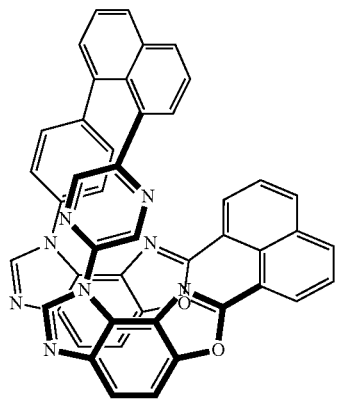
D-34
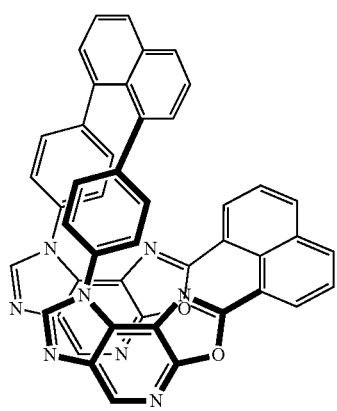

-continued
D-35
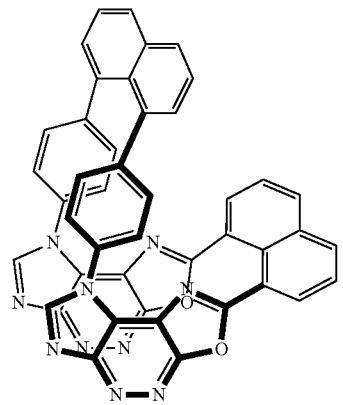
D-36
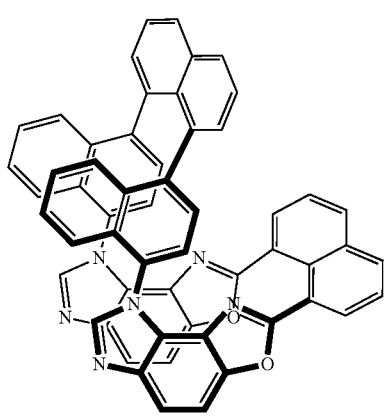
D-37
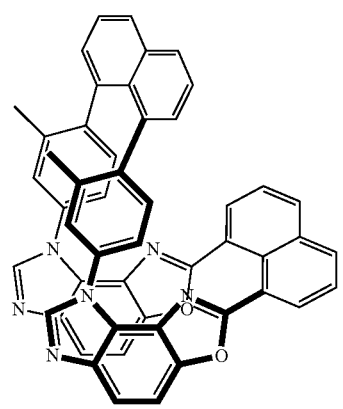
D-38
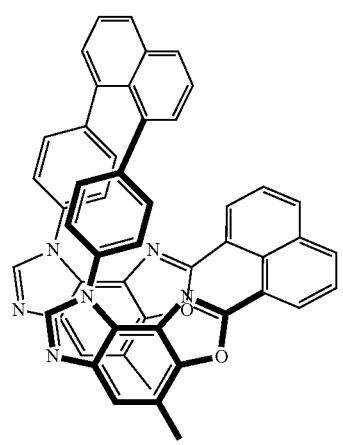
-continued
D-39
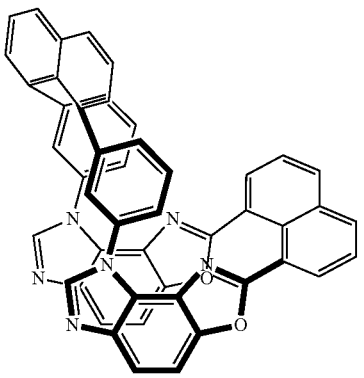
E-1
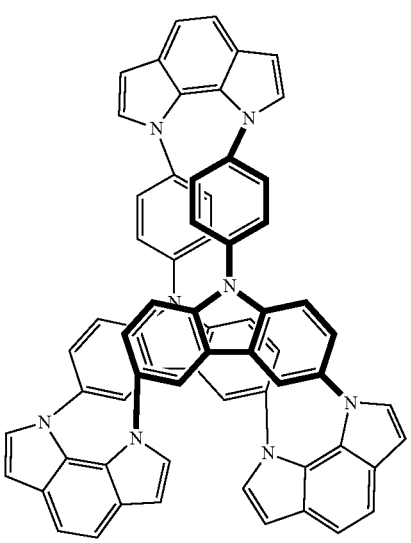
E-2
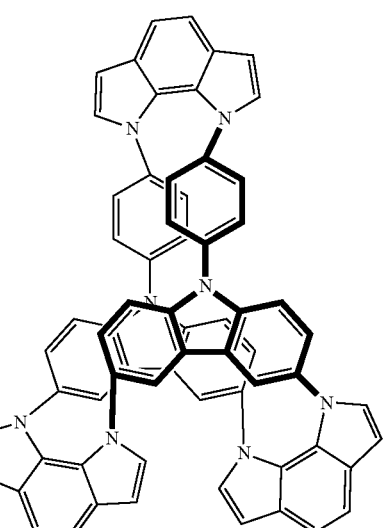

E-3
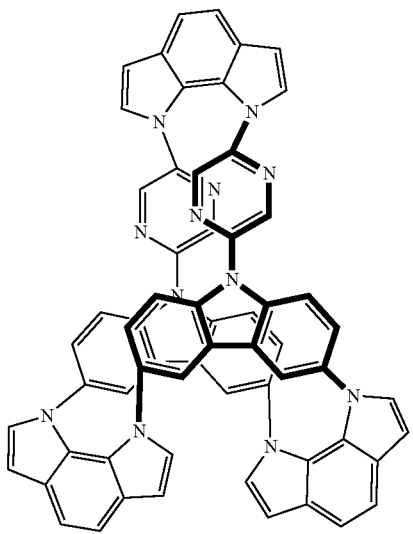
E-4
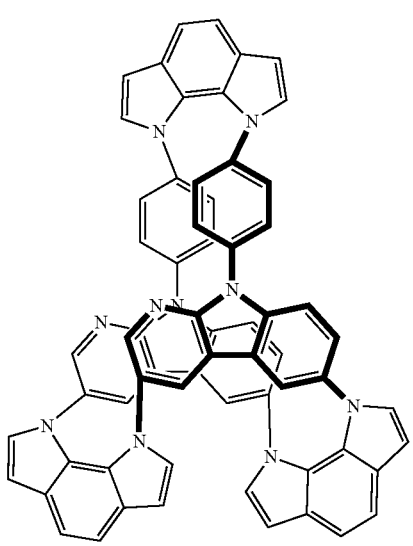
E-5
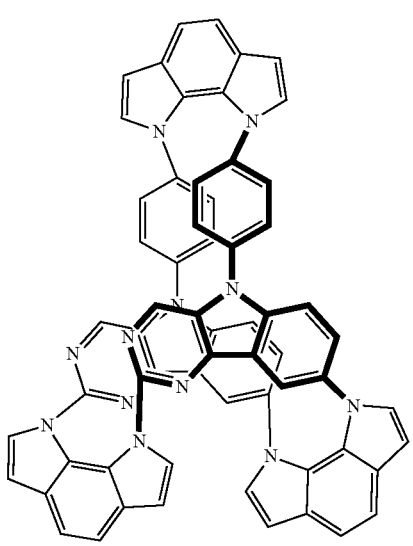
E-6
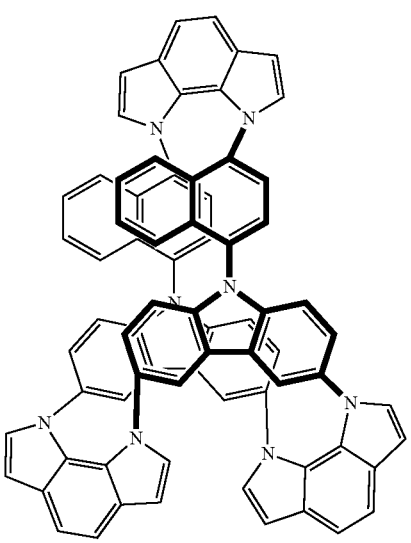
E-7
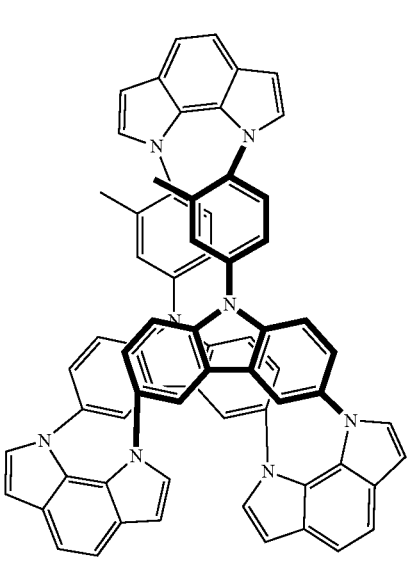
E-8
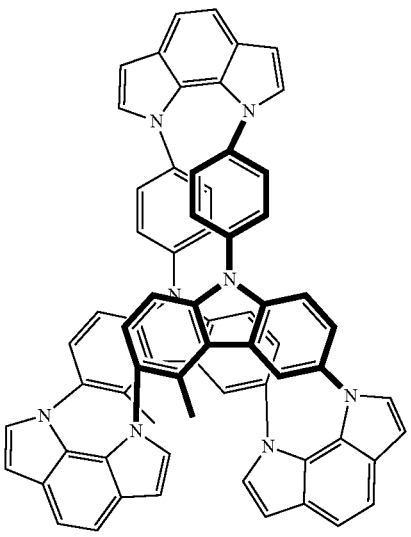

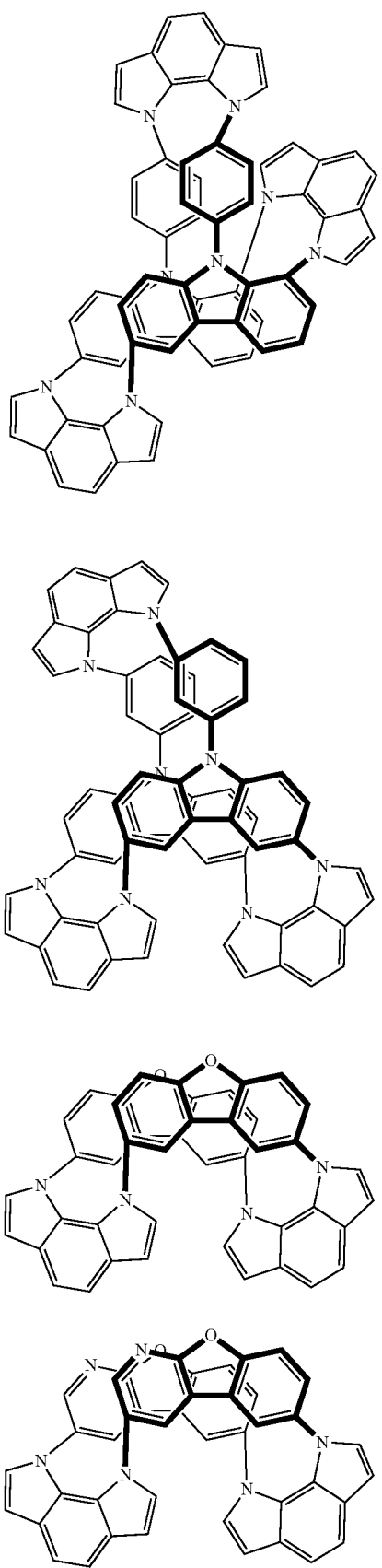
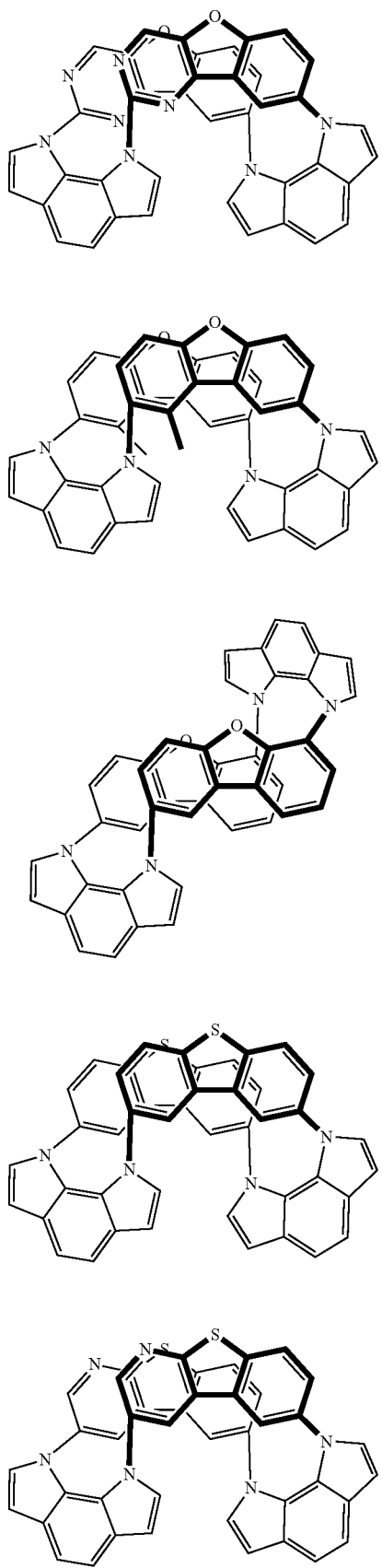

-continued
E-18
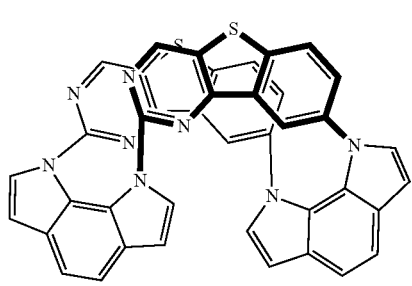
E-19
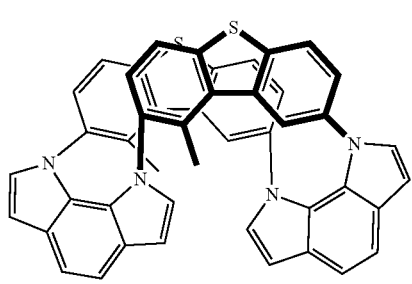
E-20
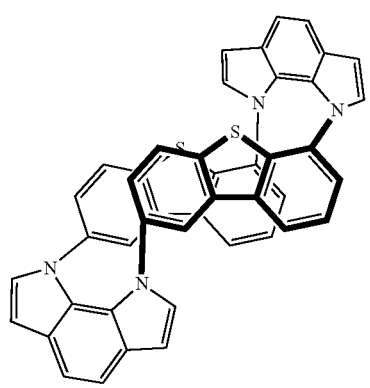
E-24
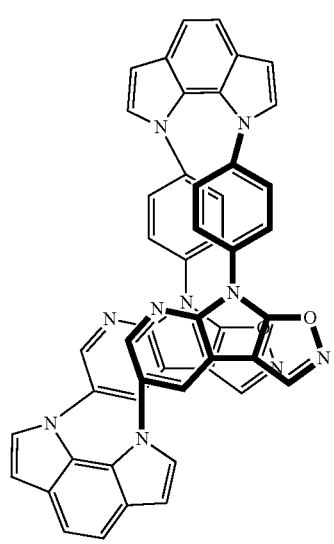
-continued
E-25
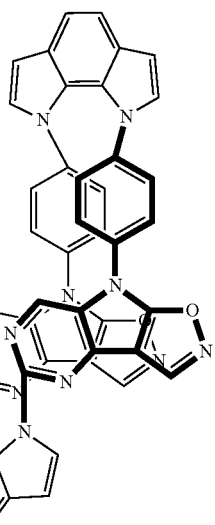
E-31
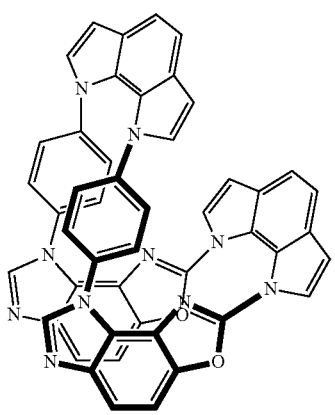
E-32
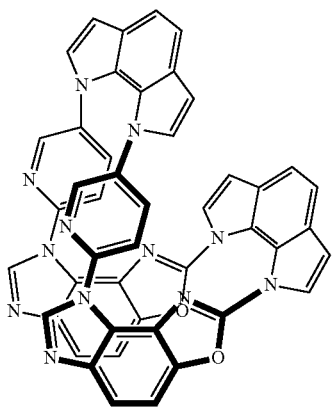

E-33
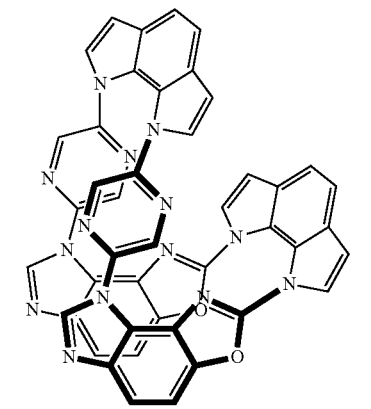
E-34
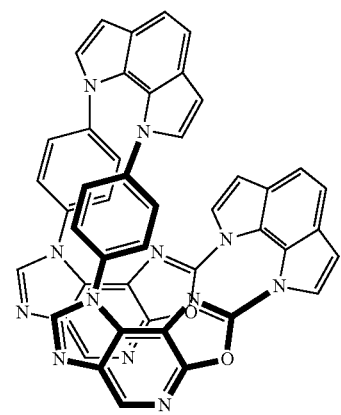
E-35
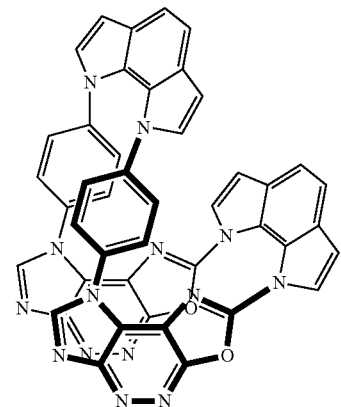
E-36
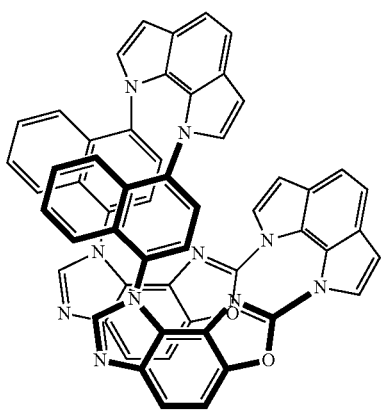
E-37
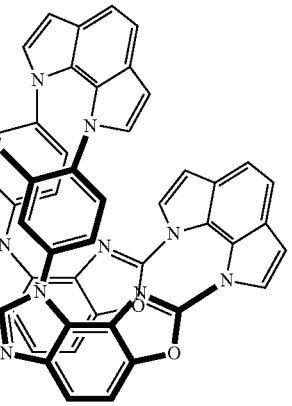
E-38
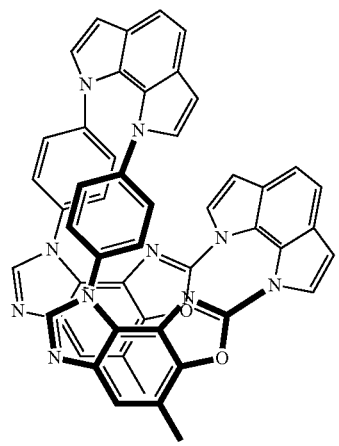
E-39
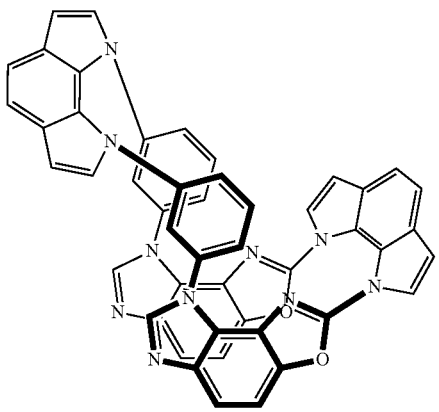
F-1
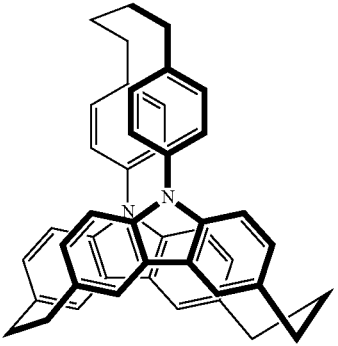

-continued
F-2
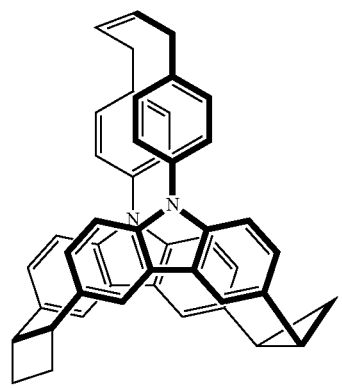
F-3
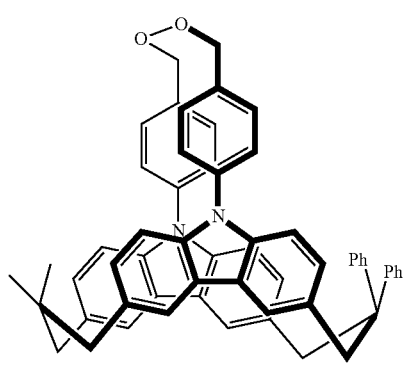
F-4
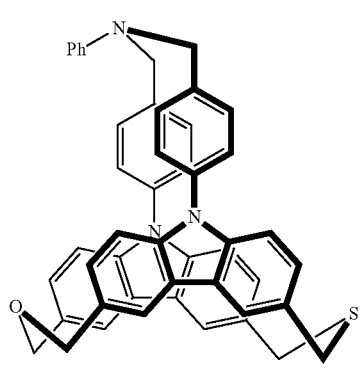
F-5
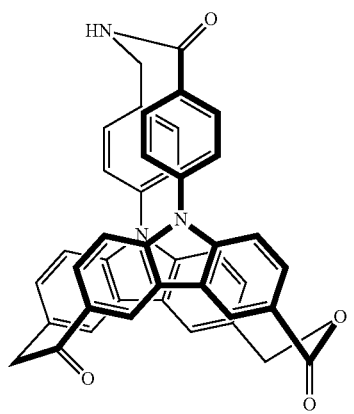
-continued
F-6
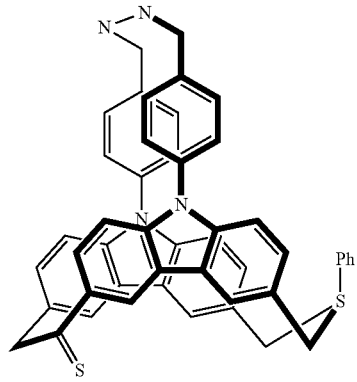
F-7
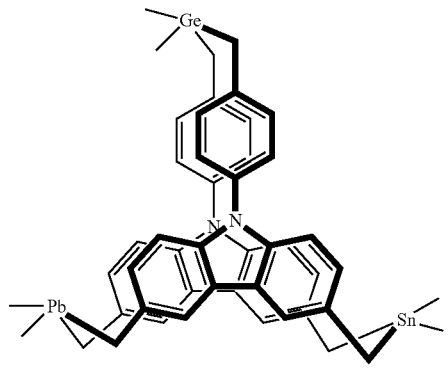
F-8
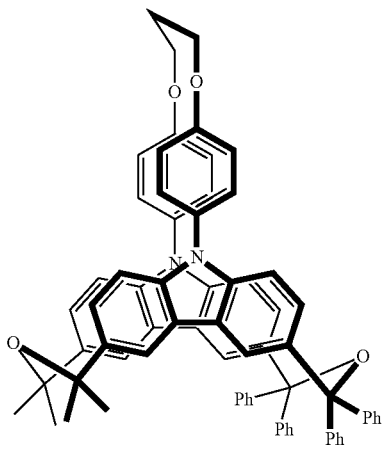
F-9
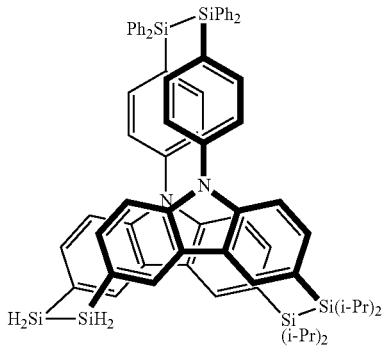

F-10
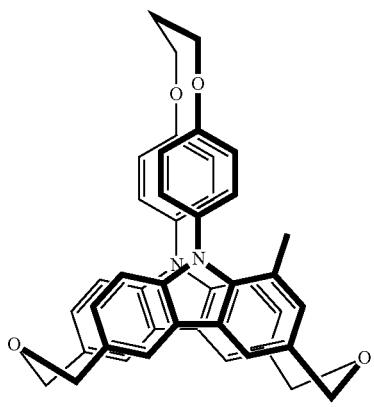
G-2
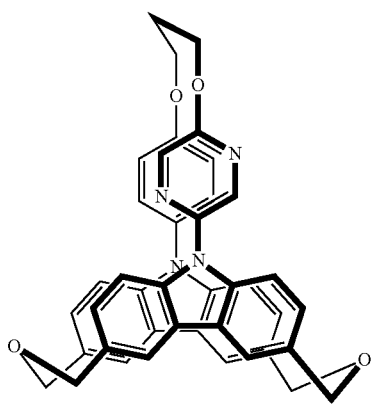
G-3
G-1
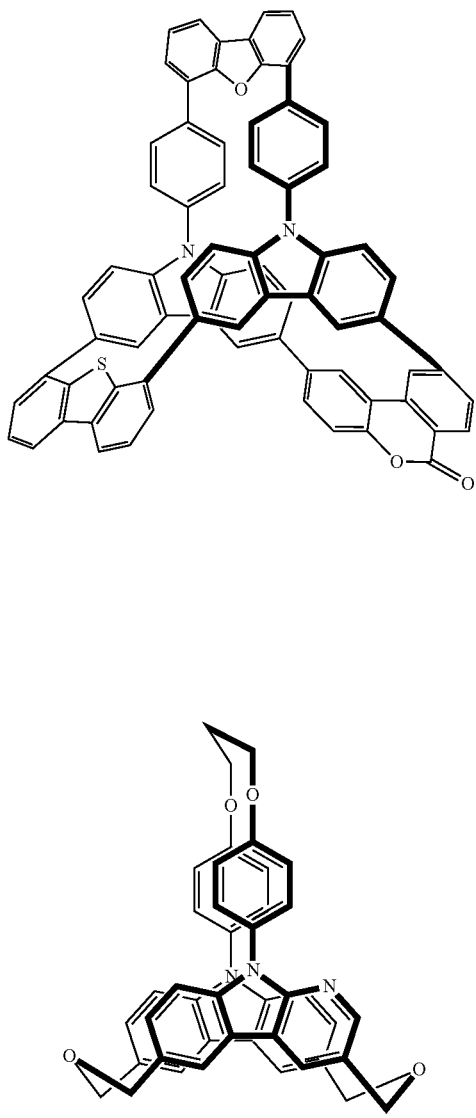
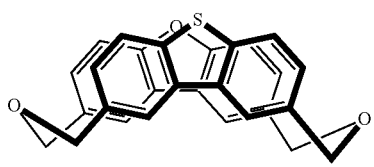
G-4
The compounds relating to the present invention may be synthesized with the method described in the literature of "Y. Nakamura et al., Bull. Chem. Soc. Jpn, 2009, 82, 2743".
For example, a compound A-1 described in Example may be synthesized according to the following synthetic scheme.
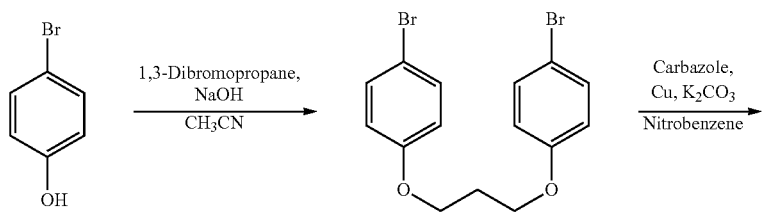
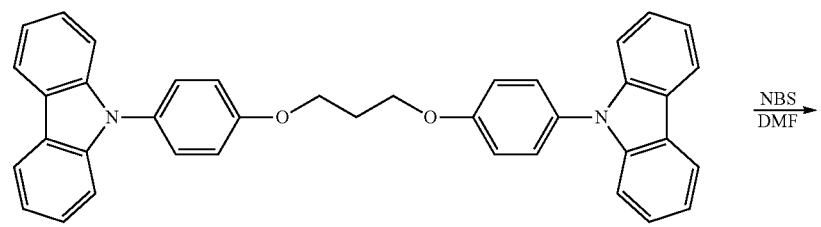

-continued

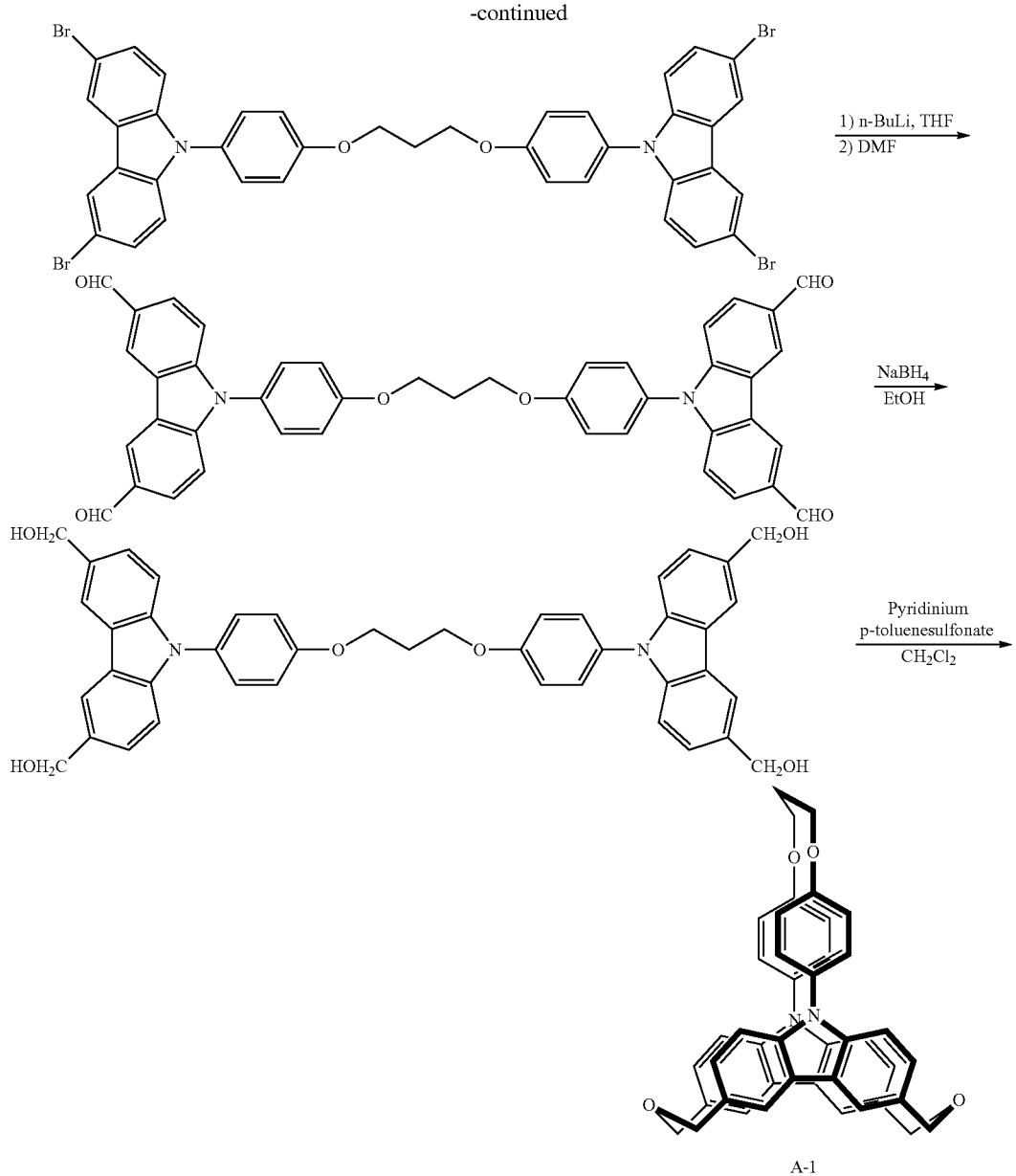

A-1

<Organic EL Element>

In the following, a constitution of an organic EL element in an embodiment of the present invention will be described by referring to FIG. 4. The present invention is not limited to the following embodiment as long as it contains the feature of the present invention. The present invention encompasses a various types of modifications.

Figure 4:
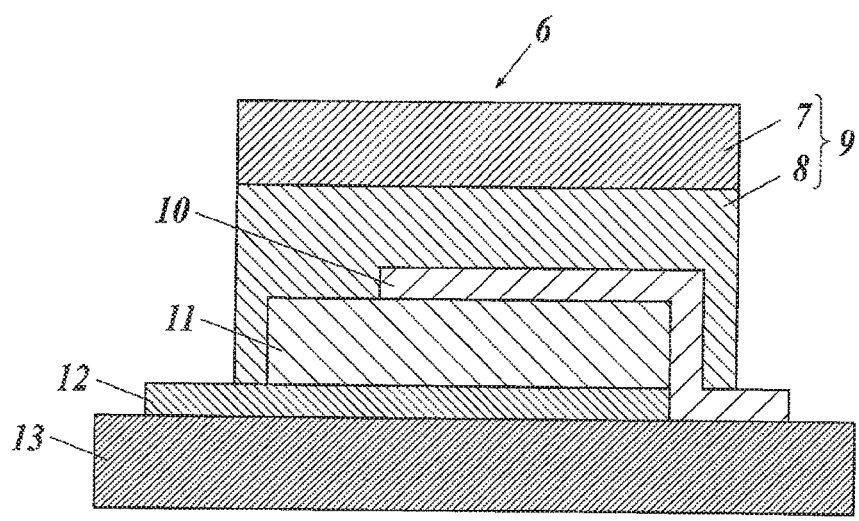
FIG. 4 is a schematic drawing of an organic electroluminescent element.

FIG. 4 is a schematic drawing illustrating an example of a constitution of an organic electroluminescent element. In an organic EL element 6 of the present invention, an anode 12, a cathode 10, and an organic functional layer 11 are interposed and closely sealed with a sealing material 9 in order to keep the anode 12, the cathode 10, and the organic functional layer 11 in a low humidity condition and to block or protect them from the outer environment.

Here, the sealing material 9 contains a sealing member 7 on the surface of which is formed an adhesive layer 8. By close adhesion of the adhesive layer 8 to the anode 12, the cathode 10, and the organic functional layer 11, the adhesive layer 8 seals the anode 12, the cathode 10, and the organic functional layer 11.

The organic functional layer 11 is a thin film having charge transport ability. The light-emitting layer will emit light by applying voltage to both electrode of the organic EL element 6.

<<Element Substrate>>

An element substrate which may be used for an organic EL element of the present invention, an organic thin film solar cell, and a dye sensitized solar cell is not specifically limited to the types of glass and plastics. They me be transparent or opaque. However, a transparent support substrate is preferable when the emitting light is taken from the side of the support substrate. Support substrates preferably utilized includes glass, quartz and transparent resin film. A specifically preferable support substrate is a resin film capable of providing an organic EL element with a flexible property.

Examples of a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyallylates and cycloolefin resins such as ARTON (trade name, made by JSR Co. Ltd.) and APEL (trade name, made by Mitsui Chemicals, Inc.). When the emitted light is passed through the sealing member, it may be selected materials other than the transparent resins. Examples thereof are metals such as: copper, copper alloy, aluminum, aluminum alloy, gold, nickel, titanium, stainless steel, and tin. These may be used solely, or two or more kinds may be used by mixing or by laminating into a plurality of layers.

Although a thickness of an element substrate is not limited in particular, it is preferable to be in the range of 50 to 500 μm by considering mold workability and handling property. The thickness of an element substrate can be measured with a micrometer.

On the surface of a resin film, it may be formed a film incorporating an inorganic or an organic compound, or it may be formed a hybrid film incorporating both compounds. A preferable film is a barrier film having a water vapor permeability of 0.01 $g/m^2 \cdot 24$ h or less (at 25±0.5° C., and 90±2% RH) determined based on JIS K 7129-1992. A further preferable film is a high barrier film having an oxygen permeability of $1 \times 10^{-3}$ $cm^3/m^2 \cdot 24$ h·atm or less determined based on JIS K 7126-1987, and a water vapor permeability) of $1 \times 10^{-5}$ $g/m^2 \cdot 24$ h or less.

As materials that form a barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of an opaque support substrate include metal plates such aluminum or stainless steel films, opaque resin substrates, and ceramic substrates.

<<Anode>>

As an anode used for applying an electric field to an organic functional layer, preferably used electrode substances are a metal having a large work function (4 eV or more, preferably, 4.5 eV or more), an alloy, and a conductive compound and a mixture thereof. Specific examples of an electrode substance are: metals such as Au; transparent conductive materials such as CuI, indium tin oxide (ITO), $SnO_2$, and ZnO. Further, a material such as IDIXO ($In_2O_3$—ZnO), which can form an amorphous and transparent electrode, may also be used.

As for an anode, these electrode substances may be made into a thin layer by a method such as a vapor deposition method or a sputtering method; followed by making a pattern of a desired form by a photolithography method. Otherwise, in the case of requirement of pattern precision is not so severe (about 100 μm or more), a pattern may be formed through a mask of a desired form at the time of layer formation with a vapor deposition method or a sputtering method using the above-described material.

Alternatively, when a coatable substance such as an organic conductive compound is employed, it is possible to employ a wet film forming method such as a printing method or a coating method. When emitted light is taken out from the anode, the transmittance is preferably set to be 10% or more. A sheet resistance of a first electrode is preferably a few hundred Ω/sq or less.

Further, although a layer thickness of the anode depends on a material, it is generally selected in the range of 10 nm to 1 μm, and preferably in the range of 10 to 200 nm.

<<Cathode>>

As a cathode, a metal having a small work function (4 eV or less) (it is called as an electron injective metal), an alloy, a conductive compound and a mixture thereof are utilized as an electrode substance. Specific examples of the aforesaid electrode substance includes: sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, aluminum, and a rare earth metal. Among them, with respect to an electron injection property and durability against oxidation, preferable are: a mixture of election injecting metal with a second metal which is stable metal having a work function larger than the electron injecting metal. Examples thereof are: a magnesium/silver mixture, a magnesium/aluminum mixture, a magnesium/indium mixture, an aluminum/aluminum oxide ($Al_2O_3$) mixture, a lithium/aluminum mixture and aluminum.

A cathode may be made by using these electrode substances with a method such as a vapor deposition method or a sputtering method to form a thin film. A sheet resistance of a cathode is preferably a few hundred Ω/sq or less. A layer thickness of the cathode is generally selected in the range of 10 nm to 5 μm, and preferably in the range of 50 to 200 nm.

Further, after forming a layer of the aforesaid metal having a thickness of 1 to 20 nm on the cathode, it is possible to prepare a transparent or translucent cathode by providing with a conductive transparent material described in the description for the anode thereon. By applying this process, it is possible to produce an element in which both an anode and a cathode are transparent.

<<Organic Functional Layer>>

Forming methods of organic functional layers according to the present invention are not specifically limited. They may be formed by using a known method such as a vacuum vapor deposition method or a wet method (wet process).

Examples of a wet process include: a spin coating method, a cast method, an inkjet method, a printing method, a die coating method, a blade coating method, a roll coating method, a spray coating method, a curtain coating method, and a LB method (Langmuir Blodgett method). From the viewpoint of getting a uniform thin layer with high productivity, preferable are methods highly appropriate to a rollto-roll method such as a die coating method, a roll coating method, an inkjet method, and a spray coating method.

Examples of a liquid medium to dissolve or to disperse a material for organic layers according to the present invention include: ketones such as methyl ethyl ketone and cyclohexanone; aliphatic esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; organic solvents such as DMF and DMSO.

These will be dispersed with a dispersion method such as an ultrasonic dispersion method, a high shearing dispersion method and a media dispersion method.

A different film forming method may be applied to every organic layer. When a vapor deposition method is adopted for forming each layer, the vapor deposition conditions will change depending on the compounds used. Generally, the following ranges are suitably selected for the conditions, heating temperature of boat: 50 to 450° C., level of vacuum: $10^{-6}$ to $10^{-2}$ Pa, vapor deposition rate: 0.01 to 50 nm/sec, temperature of substrate: −50 to 300° C., and layer thickness: 0.1 nm to 5 µm, preferably 5 to 200 nm.

Formation of organic layers of the present invention is preferably continuously carried out from a hole injection layer to a cathode with one time vacuuming. It may be taken out on the way, and a different layer forming method may be employed. In that case, the operation is preferably done under a dry inert gas atmosphere.

The layers constituting the organic functional layers will be described in the following. Since known materials can be used for forming each layer of the organic functional layers, the explanation of the specific materials will be omitted. Known methods such as vapor deposition methods and coating methods can be used for the production methods of the organic functional layers. Therefore, the explanation of the production methods will be omitted.

Preferable laminating layer examples of the organic functional layers are as follows. In the constitutions of (1) to (7), usually the layer described in the former is located at an anode side, then, the remaining layers are laminated in the described order to a cathode side.

(1) Light-emitting layer/electron transport layer
(2) Hole transport layer/light-emitting layer/electron transport layer
(3) Hole transport layer/light-emitting layer/electron injection layer
(4) Hole transport layer/light-emitting layer/hole blocking layer/electron transport layer
(5) Hole transport layer/light-emitting layer/hole blocking layer/electron transport layer/electron injection layer (cathode buffer layer)
(6) Hole injection layer (anode buffer layer)/hole transport layer/light-emitting layer/hole blocking layer/electron transport layer/electron injection layer
(7) Hole injection layer/hole transport layer/light-emitting layer/electron transport layer/electron injection layer (Light-emitting layer)

A light-emitting layer is a layer which emits light by recombination of holes and electrons. Here, holes are injected directly from the anode or through the hole transport layer from the anode, and electrons are injected directly from the cathode or through the electron transport layer from the cathode. The light-emitting portion may be either an inside of the light emitting-layer or at an interface between the light-emitting layer and an adjacent layer to the light-emitting layer.

It is preferable that the light-emitting layer is formed with an organic light-emitting material containing a host compound (a host material) and a light-emitting material (a light-emitting dopant compound). When the light-emitting layer has a constitution as described above, any required emission color will be obtained by suitably selecting an emission wavelength of the light-emitting material and a kind of the light-emitting material. Further, by making the constitution of the light-emitting layer as described above, the light emitting material of the light-emitting material can emit light in the light-emitting layer.

A total thickness of the light-emitting layer is suitably determined according to the required emission property. For example, the total thickness of the light-emitting layer is preferably in the range of 1 to 200 nm from the viewpoint of uniformity of the light-emitting layer, prevention of unnecessary application of high voltage during light emission, and improved emission color with respect to the driving electric current. In particular, it is preferable that the total thickness of the light-emitting layer is 30 nm or less from the viewpoint of low driving voltage.

At least one light-emitting layer of an organic EL element of the present invention contains a host compound having condensed aromatic rings each bonded with a linking group and forming a π-π stacking structure with the condensed aromatic rings in the molecule.

The host compound in the light-emitting layer is preferably a compound having a phosphorescence quantum yield of 0.1 or less at room temperature (25° C.), more preferably, it is a compound having a phosphorescence quantum yield of 0.01 or less.

A volume ratio of the host compound in the light-emitting layer is preferably 50% or more with respect to all of the compounds contained in the light-emitting layer.

As a light-emitting material contained in the light-emitting layer, it may be used a phosphorescent material (a phosphorescent compound, or a phosphorescence emitting compound), or a fluorescent material. One kind of light-emitting material may be contained in one light-emitting material, or a plurality of light-emitting materials having a different emission maximum wavelength may be contained. By using a plurality of light-emitting materials, it can emit light by mixing light having a different emission wavelength to result in obtaining a required emission color. Specifically, it may be obtained white light by incorporating a blue emitting material, a green emitting material, and a red emitting material (three kinds of emitting materials) in the light-emitting layer, for example.

(Injection Layer: Hole Injection Layer and Electron Injection Layer)

An injection Layer is a layer to achieve decrease of driving voltage or to improve emission luminance. The injection layer is usually arranged between an electrode and a light-emitting layer. The injection layer is roughly classified into 2 types. Namely, the injection layer is classified into a hole injection layer to inject holes (carrier), and an electron injection layer to inject electrons (carrier). The hole injection layer is arranged between the anode and the light-emitting layer or the hole transport layer. Further, the electron injection layer (cathode buffer layer) is arranged between the cathode and the light-emitting layer or the electron transport layer.

(Blocking Layer: Electron Blocking Layer and Hole Blocking Layer)

A blocking layer is a layer to block the transport of carriers (holes and electrons). The blocking layer is roughly classified into 2 types. Namely, the blocking layer is classified into a hole blocking layer to block the transport of holes (carrier), and an electron blocking layer to block the transport of electrons (carrier).

A hole blocking layer is, in a broad meaning, a layer provided with a function of electron transport layer (electron transport function). The hole blocking layer is composed of a material having a function of transporting an electron but a very small ability of transporting a hole. By locating the hole blocking layer, it can make a suitable balance of injection of holes and electrons in the light-emitting layer. In addition, it can improve the recombination probability of an electron and a hole.

Further, a constitution of an electron transport layer described later can be appropriately utilized as a hole blocking layer according to necessity. When the hole blocking layer is located, the hole blocking layer is preferably arranged adjacent to the light-emitting layer.

On the other hand, the electron blocking layer is, in a broad meaning, a layer provided with a function of hole transport layer (hole transport function) described later. The electron blocking layer is composed of a material having a function of transporting a hole but a very small ability of transporting an electron. By locating the electron blocking layer, it can make a suitable balance of injection of holes and electrons in the light-emitting layer. In addition, it can improve the recombination probability of an electron and a hole. Further, a constitution of a hole transport layer described later can be appropriately utilized as an electron blocking layer according to necessity.

The thickness of the blocking layer is not limited in particular. The thickness is preferably 3 nm or more, more preferably 5 nm or more, and it is preferably 100 nm or less, more preferably 30 nm or less.

(Transport Layer: Hole Transport Layer and Electron Transport Layer)

A transport layer is a layer to transport the carriers (holes and electrons). The transport layer is roughly classified into 2 types. Namely, the transport layer is classified into a hole transport layer to transport the holes (carrier), and an electron transport layer to transport the electrons (carrier).

A hole transport layer is a layer to transport (inject) the holes supplied from the anode to the light-emitting layer. The hole transport layer is placed between the anode or the hole injection layer and the light-emitting layer. The hole transport layer works as a barrier to block the electrons coming from the cathode side. Therefore, the term of "hole transport layer" may be used, in a broad meaning, to contain at least one of the hole injection layer and the electron blocking layer. In addition, the hole transport layer may be only one layer, or a plurality of hole transport layers may be provided.

An electron transport layer is a layer to transport (inject) the electrons supplied from the cathode to the light-emitting layer. The electron transport layer is placed between the cathode or the electron injection layer and the light-emitting layer. The electron transport layer works as a barrier to block the holes coming from the anode side. Therefore, the term of "electron transport layer" may be used, in a broad meaning, to contain at least one of the electron injection layer and the hole blocking layer. In addition, the electron transport layer may be only one layer, or a plurality of electron transport layers may be provided.

An electron transport material (it may be used as a hole blocking material) used for an electron transport layer (when one electron transport layer is used, it indicates this layer; and when a plurality of electron transport layers are used, it indicates a layer located at the nearest position to the light-emitting layer) is not limited in particular. However, the usable electron transport material for the electron transport layer is usually a material having a function of transmit (transport) electrons injected from the cathode to the light-emitting layer.

(Sealing Material)

The sealing material of the present invention is composed of a sealing member and an adhesive layer. An adhesive layer is formed on a flexible sealing member. By sticking the sealing material to the anode, the cathode, and the organic functional layers, the organic EL element can be blocked or protected from the outer environment.

The sealing material may be made in a shape corresponding to the anode, the cathode, and the organic functional layers. As long as the required sealing property is achieved, the shape of the sealing material is not limited in particular. By making the shape of the sealing material, and by sticking it to the anode, the cathode, and the organic functional layers, improved productivity may be attained.

(Sealing Member)

The sealing member according to the present invention will be described in the following. The sealing member has a function of blocking and protecting the organic EL element against the outer environment. Preferably, the sealing member is flexible, and it has a mechanical strength and a gas barrier property to a water vapor and oxygen.

Examples of a substance constituting the sealing member are: thermoplastic resins such as ethylene-tetrafluoroethylene copolymer, polyethylene, polypropylene, polystyrene, polymethyl methacrylate, Nylon, polyethylene terephthalate, polyethylene naphthalate, polycarbonate, polyimide, and polyether sulfone; curable resins such as urea resin, melamine resin, phenol resin, resorcinol resin, epoxy resin, unsaturated polyester resin, polyurethane resin, and acrylic resin; and metals such as copper, copper alloy, aluminum, aluminum alloy, gold, nickel, titanium, stainless steel, and tin.

These substances may be used solely, or it may be used by mixing a plurality of substances according to requirement. It may be used as a multiple laminated layer formed with sticking, extrusion lamination or co-extrusion. Further, in order to obtain the required physical properties, it may be made by combining the conditions of the thickness, the density and molecular weight of the compound in the sheet, In the present invention, it is preferable to employ a polymer film or a metal film. Further, it is preferable that the polymer film has an oxygen permeability of $1\times10^{-3}$ cm$^3$/m$^2\cdot$24 h or less determined by the method based on JIS K 7126-1987, and a water vapor permeability of $1\times10^{-3}$ g/m$^2\cdot$24 h or less (at 25±0.5° C., and 90±2% RH) determined by the method based on JIS K 7129-1992.

Although a thickness of the sealing member is not limited in particular, it is preferable to be from 10 μm to 300 μm by considering shape forming workability, handling, and stress cracking resistivity of the barrier layer. Here, the thickness of the sealing member can be measured with a micrometer.

When a thermoplastic resin or a curable resin is used as a sealing member, it is preferable to form a gas barrier layer on the sealing member with a vapor deposition method or a coating method. Examples of a gas barrier layer are: a metal vapor deposition film, an inorganic compound vapor deposition film, and a metal foil. As a metal vapor deposition film and an inorganic compound vapor deposition film, it can be used a vapor deposition film described in pp. 879-901 of "Thin Film Handbook" (Japan Society for the Promotion of Science), pp. 502-509, p. 612, and p. 810 of "Vacuum Technology Handbook" (Nikkan Kogyo Shimbun, Ltd), and pp. 132-134 of "Vacuum Handbook, New Edition" (UL-VAC, Inc.). Examples thereof are: metals such as In, Sn, Pb, Ag, Cu, Ag, Al, Ti, Ni, and W; and MgO, SiO, $SiO_2$, $Al_2O_3$, GeO, NiO, CaO, BaO, $Fe_2O_3$, $Y_2O_3$, $TiO_2$, $Cr_2O_3$, $Si_xO_y$, (x=1, y=1.5 to 2.0), $Ta_2O_3$, ZrN, SiC, TiC, PSG, $Si_3N_4$, SiN, single-crystal Si, and amorphous Si. Examples of a metal foil are: metal materials such as aluminum, copper, and nickel; and alloy materials such as stainless and aluminum alloy. Among them, aluminum is preferably used from the viewpoint of workability and cost. These may be used singly, or they may be used in combination of two or more with any combination and ratio.

A thickness of a metal vapor deposition film or an inorganic compound vapor deposition film is: preferably 5 nm or more, more preferably 10 nm or more; and preferably 1000 nm or less, more preferably 300 nm or less from the viewpoint of easy formation of a vapor deposition film. A thickness of a metal foil is preferably in the range of 1 to 100 µm, and more preferably in the range of 10 to 50 µm from the viewpoint of easy handling during production and making a thin film. Further, in order to achieve easy handling during production, it may be laminated beforehand with a resin film such as polyethylene terephthalate and Nylon. Moreover, it may be provided a protective layer made of a thermoplastic resin on the gas barrier layer.

(Adhesive Layer)

An adhesive layer is formed on the surface of a sealing member. It is sufficient that the adhesive layer is formed at least one surface of the sealing member. By sticking the surface of the sealing member having the adhesive layer with the surface of the element substrate having the organic EL element, the organic EL element can be sealed hermetically. In addition, after forming the adhesive layers of a long film on two surfaces of the sealing member, and by adhering two element substrates from the two sides, both sides of the organic EL elements may be sealed hermetically.

As an adhesive agent constituting an adhesive layer, it may be used any one of a thermo-setting resin, a photo curable resin, and a thermo-plastic resin. It is preferable to use a resin excellent in humidity resistance and water resistance, as well as having a small amount of volatile component and a small amount of contract after setting.

Examples of a thermo-setting resin are: epoxy resin, acrylic resin, silicone resin, urea resin, melamine resin, phenolic resin, resorcinol resin, unsaturated polyester resin, and polyurethane resin.

Examples of a photo curable resin are: various types of acrylates such as ester acrylate, urethane acrylate, epoxy acrylate, melamine acrylate, acrylic resin; a radical photo curable resin such as urethane polyester; and cationic photo curable resins such as epoxy resin and vinyl ether resin.

Examples of a usable thermoplastic resin are: polyethylene, polypropylene, polyamide, polyethylene terephthalate (PET), polyvinyl alcohol (PVA), ethylene-vinyl acetate copolymer (EVA), ethylene-propylene copolymer, ethylene-acrylic acid copolymer, ethylene-methacrylic acid copolymer, polyvinylidene chloride (PVDC), and ionomer. Among them, preferable resins excellent in adhesiveness to the substrate are: polyethylene, polypropylene, a polyolefin acid-modified product such as ethylene-propylene copolymer, an acid-modified product of ethylene-vinyl acetate copolymer, ethylene-acrylic acid copolymer, and ethylene-methacrylic acid copolymer. In particular, polyethylene and polypropylene are preferable since they have a small amount of outgas component that will deteriorate the organic EL element.

A thickness of an adhesive layer is preferably in the range of 1 to 100 µm from the viewpoint of sealing property and thin film formation. Examples of a usable forming method of an adhesive layer on a sealing member are: coating methods such as a gravure coating method, a roll coating method, a bar coating method, a die coating method, a knife coating method, a hot melt coating method, a dipping method, a spin coating method, and a spray coating method; and a printing method such as a screen printing method. In order to remove water contained in an inside of the adhesive layer, it may be mixed a desiccant such as barium oxide and calcium oxide.

It is preferable to add a filler to the adhesive that composes the adhesive layer according to necessity. A preferable amount of the filler is in the range of 5 to 70 volume % by considering the adhesion ability. The size of the added filler is preferably in the range of 1 to 100 µm by considering the thickness of the adhesive layer after sticking. The type of the added filler is not limited in particular. Examples thereof are: soda glass, non-alkali glass; and metal oxides such as silica, titanium dioxide, antimony oxide, titania, alumina, zirconia and tungsten oxide.

<<Protective Film and Protective Plate>>

On the aforesaid sealing film which interposes the organic layer and faces the element substrate or on the outside of the aforesaid sealing film, a protective film or a protective plate may be arranged to enhance the mechanical strength of the element. Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and decrease in thickness, it is preferable to employ a polymer film.

Example of Measurement of Thin Film Resistance with Impedance Spectroscopy

An impedance spectroscopy method is a method of analysis by performing either converting or amplifying a subtle physical property change of an organic EL element into an electric signal. It is characterized in achieving measurement of resistance (R) and capacitance (C) with high sensitivity without destructing an organic EL element. It is commonly practiced to measure electric properties by using Z plot, M plot and $\in$ plot for impedance spectroscopy analysis. The analysis method thereof is described in detail in pp. 423 to 425 of "Handbook of Thin film evaluation" published by Techno System, Co. Ltd, for example.

It will be described a method of obtaining resistance of a specified layer of an organic EL element by applying the impedance spectroscopy. Here, the organic EL element has a constitution of: [ITO/HIL (hole injection layer)/HTL (hole transport layer)/EML (light-emitting layer)/ETL (electron transport layer)/EIL (electron injection layer)/Al]. When a resistance value of an electron transport layer (ETL) is measured, for example, there are prepared EL samples each having only a different thickness of ETL. By comparing M plot of each EL samples, it can be determined the portion which corresponds to ETL in the curve of M plot.

Figure 5:
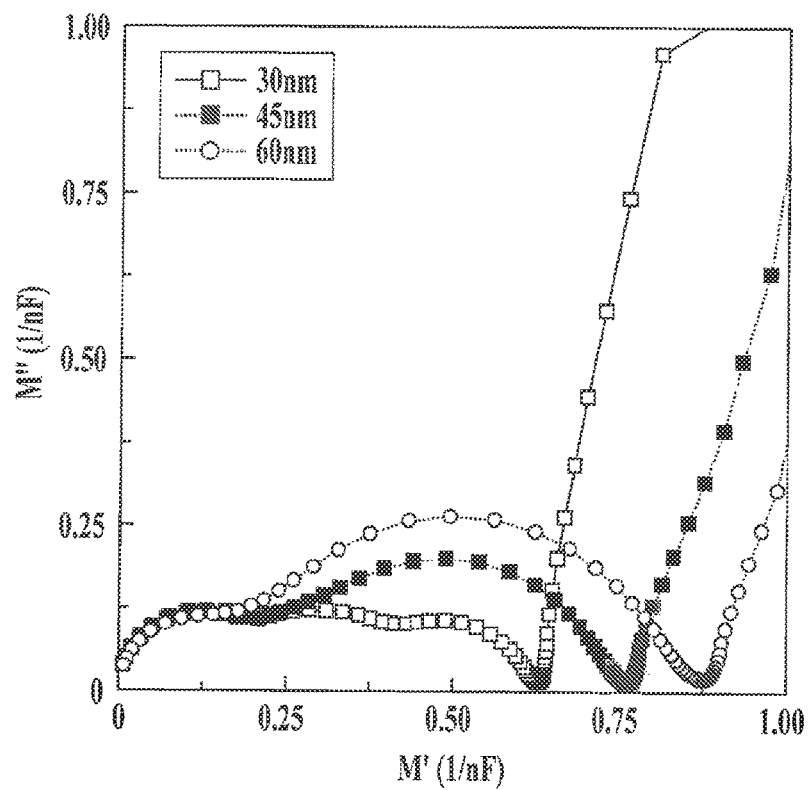
FIG. 5 is an example indicating M plots of electron transport layers each having a different thickness.

FIG. 5 is an example illustrating M plots of electron transport layers each having a different thickness. It sindictes an example of the cases having a thickness of 30, 45 and 60 nm. The resistance values (R) obtained from these plots in FIG. 5 are plotted with respect to the thickness of ETL in FIG. 6.

Figure 6:
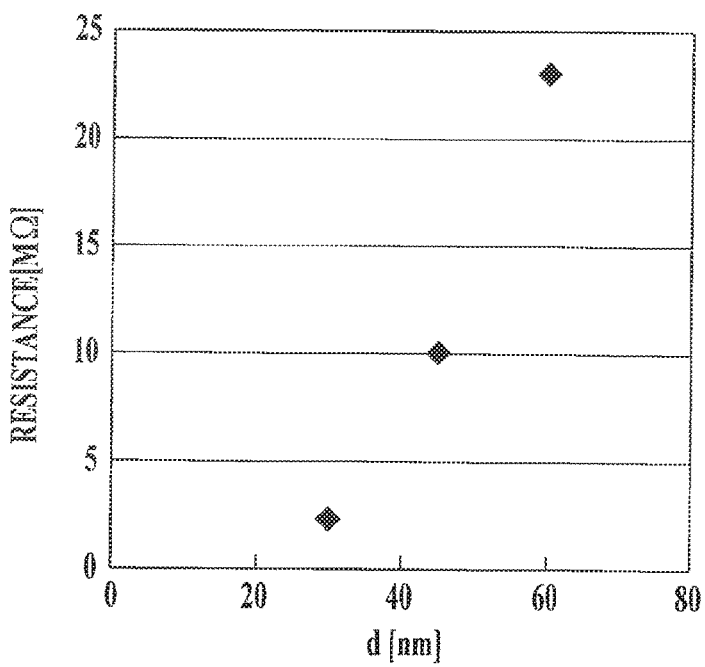
FIG. 6 is an example indicating a relationship between a layer thickness and a resistance of an electron transport layer.

FIG. 6 is an example indicating the relationship between the thickness of the electron transport layer (ETL) and the resistance value. The resistance value of each thickness can be determined since the plots having a thickness (d) of ETL and a resistance value are approximately on a straight line as shown in FIG. 6.

Figure 7:
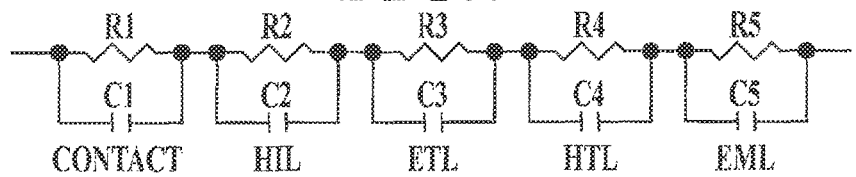
FIG. 7 is an example illustrating an equivalent circuit model of an organic electroluminescent element.
Figure 8:
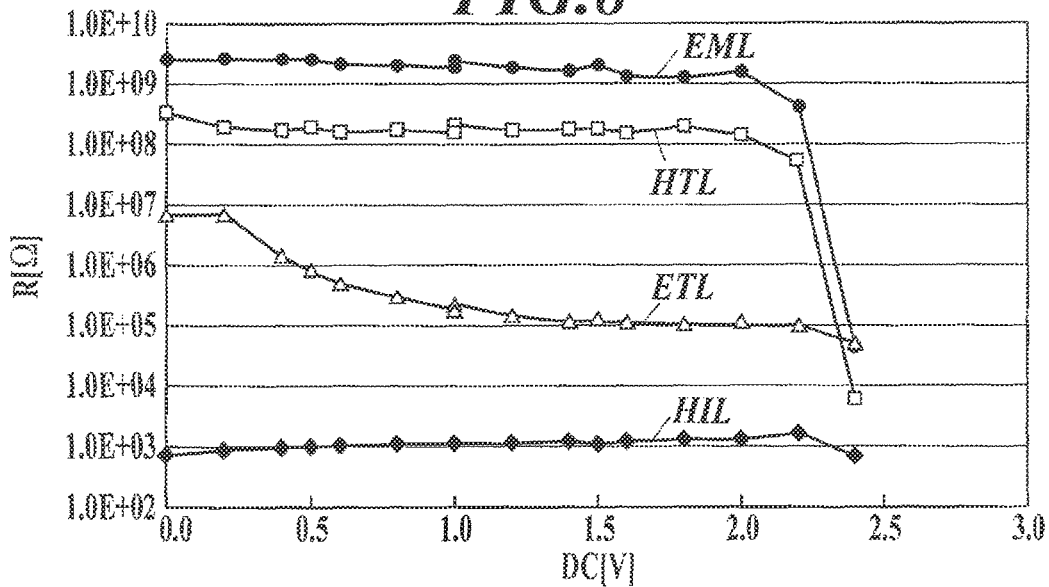
FIG. 8 is an example indicating an analytical result of an organic electroluminescent element.

An organic EL element having an element constitution of: [ITO/HIL/HTL/EML/ETL/EIL/Al] was analyzed for each layer as an example of an equivalent circuit model (FIG. 7). The results of analysis are indicated in FIG. 8. FIG. 8 is an example indicating the relationship between a resistance and a voltage for each layer.

FIG. 7 indicates an equivalent circuit model of an organic electroluminescent element having an element constitution of: [ITO/HIL/HTL/EML/ETL/EIL/Al].

FIG. 8 is an example of analysis results of an organic electroluminescent element having an element constitution of: [ITO/HIL/HTL/EML/ETL/EIL/Al].

Figure 9:
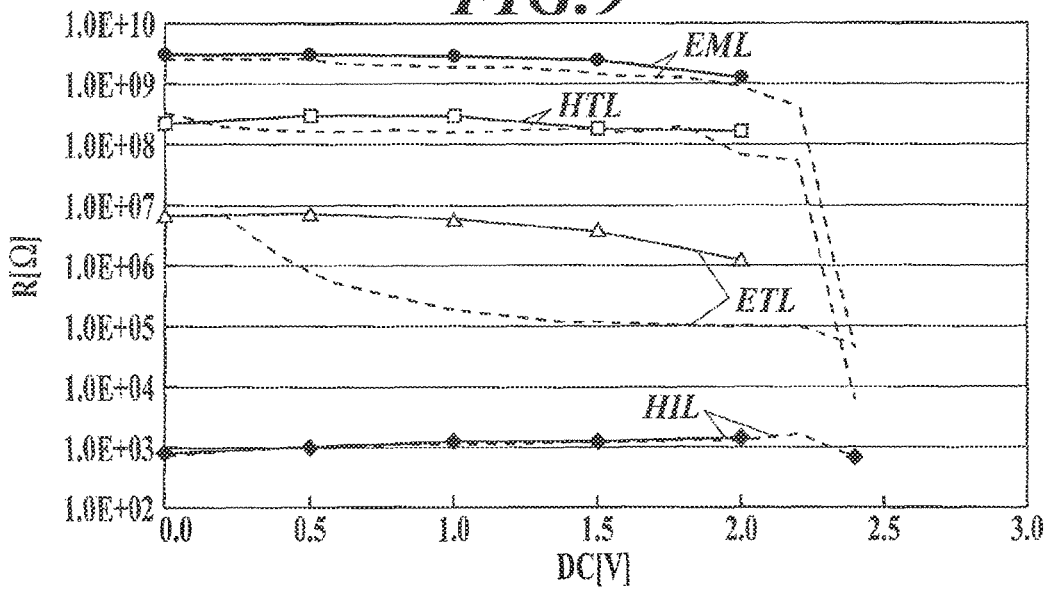
FIG. 9 is an example indicating an analytical result of an organic electroluminescent element after deterioration.

On the other hand, FIG. 9 indicates the measurement results obtained in the same conditions by using the same organic EL element with emitting light for a prolonged time and being deteriorated. The measurement results are superposed. The results at 1 V for each layer are listed in Table 1. FIG. 9 is an example indicating an analytical result of an organic electroluminescent element after deterioration.

TABLE 1

|  | HIL($\Omega$) | ETL($\Omega$) | HTL($\Omega$) | HML($\Omega$) |
|---|---|---|---|---|
| Before driving | 1.1k | 0.2M | 0.2 G | 1.9 G |
| After deterioration | 1.2k | 5.7M | 0.3 G | 2.9 G |

It was found that, in the deteriorated organic EL element, only the resistance value of ETL (electron transport layer) was largely increased, and it became about 30 times larger at 1 V of DC voltage.

By using the method described above, the change of resistance before and after applying current can be measured as described in Examples of the present specification.

<<Applications>>

It is possible to employ the organic EL element of the present invention as display devices, displays, and various types of light-emitting sources. Examples of a light-emitting source include: lighting apparatuses (home lighting and car lighting), clocks, backlights for liquid crystals, sign advertisements, signals, light sources of light memory media, light sources of electrophotographic copiers, light sources of light communication processors, and light sources of light sensors. The present invention is not limited to them. It is especially effectively employed as a backlight of a liquid crystal display device and a lighting source.

<<Display Device>>

A display device of the present invention will be described. The display device of the present invention is provided with an organic EL element of the present invention.

The display device of the present invention may emit a single color, or multiple colors. Here, it will be described a multiple color display device. In case of a multiple color display device, a shadow mask is placed only during the formation of a light-emitting layer, and a layer is formed as a whole with a vapor deposition method, a cast method, a spin coating method, an inkjet method, and a printing method.

When patterning is done only to the light-emitting layer, although the coating method is not limited in particular, preferable methods are a vapor deposition method, an inkjet method, a spin coating method, and a printing method.

A constitution of an organic EL element provided for a display device is selected from the above-described examples of an organic EL element according to the necessity.

The production method of an organic EL element is described as an embodiment of a production method of the above-described organic EL element.

When a direct-current voltage is applied to the produced multiple color display device, light emission can be observed by applying voltage of 2 o 40 V by setting the anode to have a plus (+) polarity, and the cathode to have a minus (−) polarity. When the voltage is applied to the device with reverse polarities, an electric current does not pass and light emission does not occur. Further, when an alternating-current voltage is applied to the device, light emission occurs only when the anode has a plus (+) polarity and the cathode has a minus (−) polarity. In addition, an arbitrary wave shape may be used for applying alternating-current.

The multiple color display device may be used for a display device, a display, and a variety of light-emitting sources. In a display device or a display, a full color display is possible by using 3 kinds of organic EL elements emitting blue, red and green.

Examples of a display device or a display are: a television set, a personal computer, a mobile device, an AV device, a character broadcast display, and an information display in a car. Specifically, it may be used for a display device reproducing a still image or a moving image. When it is used for a display device reproducing a moving image, the driving mode may be any one of a passive-matrix mode and an active-matrix mode.

Examples of light-emitting sources include: home lighting, car lighting, backlights for clocks and liquid crystals, sign advertisements, signals, light sources of light memory media, light sources of electrophotographic copiers, light sources of light communication processors, and light sources of light sensors. The present invention is not limited to them.

EXAMPLES

Hereafter, the present invention will be described specifically by referring to Examples, however, the present invention is not limited to them. In Examples, the term "parts" or "%" is used. Unless particularly mentioned, it represents "mass parts" or "mass %".

An organic EL element having a light-emitting layer using an organic material of the present invention enables to suppress the morphology change when a voltage is applied. In order to confirm this effect, organic EL elements were prepared in accordance with the processes described in the following. Then, they were evaluated.

The compounds used in the present Examples have the following chemical structures.

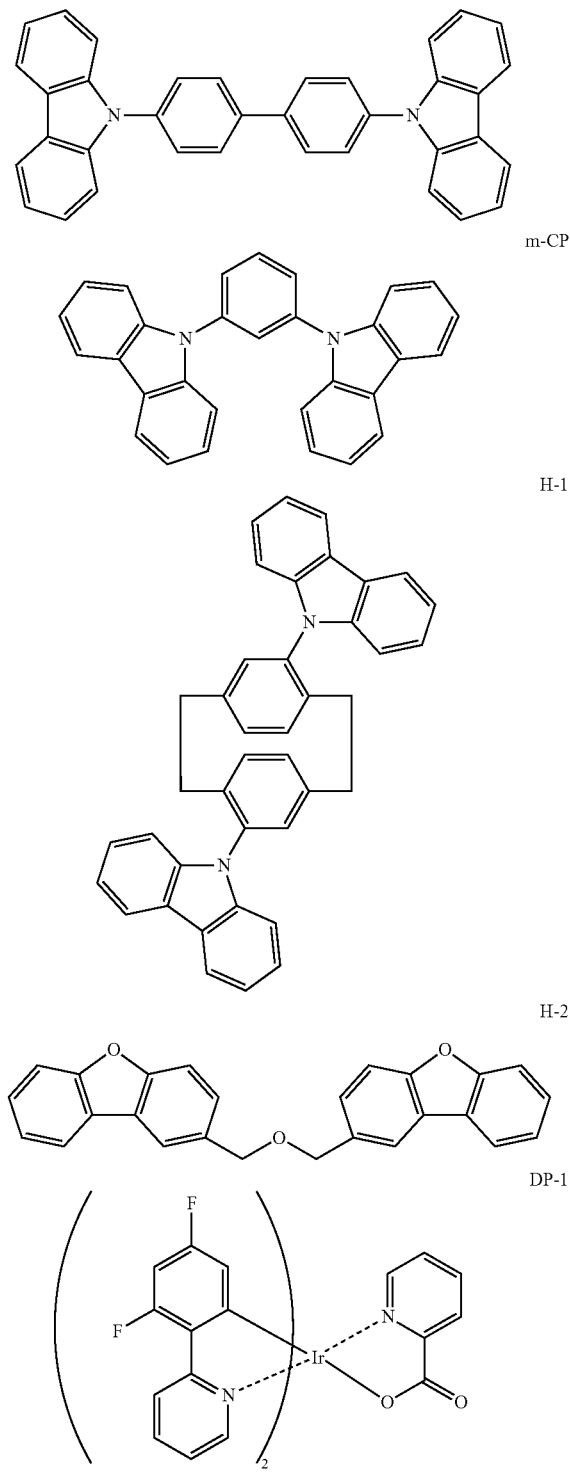

Compounds H-1 and H-2 may form both of the structures illustrated in FIG. 1A and FIG. 1B. Basically, they form selectively a trans conformation illustrated in FIG. 1B. It does not have an overlap of π-planes of the condensed aromatic rings. Therefore, these compounds are not a compound having a π-π stacking structure with the condensed aromatic rings in the molecule.

<<Preparation of Organic EL Element 1-1>>

An anode was prepared by making patterning to a glass substrate of 100 mm×100 mm×1.1 mm (NA45, produced by NH Techno Glass Corp.) on which ITO (indium tin oxide) was formed with a thickness of 100 nm. Thereafter, the above transparent element substrate provided with the ITO transparent electrode was subjected to ultrasonic washing with isopropyl alcohol, followed by drying with desiccated nitrogen gas, and was subjected to UV ozone washing for 5 minutes.

On the transparent element substrate thus prepared was applied a 70% solution of poly(3,4-ethylenedioxythiphene)-polystyrene sulfonate (PEDOT/PSS, Baytron P AI 4083, made by Bayer AG.) diluted with pure water by using a spin coating method at 3,000 rpm for 30 seconds to form a film and then it was dried at 200° C. for one hour. A hole injection layer having a thickness of 20 nm was prepared.

The resulting transparent element substrate was fixed to a substrate holder of a commercial vacuum deposition apparatus. Separately, 200 mg of α-NPD (4,4'-bis[N-(1-naphtyl)-N-phenylamino]biphenyl) was placed in a molybdenum resistance heating boat, 200 mg of CBP (4,4'-N,N'-dicarbazole) as a host material was placed in another molybdenum resistance heating boat, 200 mg of DP-1 (light-emitting material) was placed in another molybdenum resistance heating boat, and 200 mg of BCP (2,9-dimethyl-4,7-diphenyl-1,10-phenanthroline) was placed in another molybdenum resistance heating boat. The resulting boats were fitted in the vacuum deposition apparatus.

Subsequently, after reducing the pressure of a vacuum tank to $4 \times 10^{-4}$ Pa, the aforesaid heating boat containing α-NPD was heated via application of electric current and deposition was made onto the aforesaid hole injection layer at a deposition rate of 0.1 nm/second, whereby it was produced a hole transport layer having a thickness of 30 nm.

Further, the aforesaid heating boats each respectively containing CBP (host material) and DP-1 were heated via application of electric current and co-deposition was carried out onto the aforesaid hole transport layer at a respective deposition rate of 0.1 nm/second and 0.010 nm/second, whereby it was produced a light-emitting layer having a thickness of 40 nm.

Further, the aforesaid heating boat containing BCP was heated via application of electric current and deposition was carried out onto the aforesaid light-emitting layer at a deposition rate of 0.1 nm/second, whereby it was produced an electron transport layer having a thickness of 30 nm.

Subsequently, 0.5 nm thick lithium fluoride was vapor deposited as a cathode buffer layer, and then, 110 nm thick aluminum was vapor deposited to form a cathode, whereby an organic EL element 1-1 was prepared.

<<Preparation of Organic EL Elements 1-2 to 1-15>>

Organic EL elements 1-2 to 1-15 were prepared in the same manner as preparation of the organic EL element 1-1 except that CBP was changed with the compounds described in Table 2.

Example of Measurement of Thin Film Resistance with Impedance Spectroscopy (1) Change Rate of Resistance Before and after Driving of Organic EL Element By referring to the description in pp. 423 to 425 of "Handbook of Thin film evaluation" published by Techno System, Co. Ltd, and by using a 1260 type impedance analyzer with a 1296 type dielectric interface (made by Solartron Co.), the resistance value of the light-emitting layer of the prepared organic EL element at a bias voltage of 1 V was measured.

Each organic EL element was driven with a constant electric current of 2.5 mA/cm² at room temperature (about 23° C. to 25° C.) for 1,000 hours. The resistance values of the light-emitting layer of organic EL elements were respectively measured at the moment of before and after driving. The change rate of resistance was obtained according to the following calculating formula. In Table 1, the results were described as a relative value when the change rate of resistance for the organic EL element 1-1 was set to be 100.

Change rate of resistance before and after driving=
[(Resistance after driving/Resistance before driving)−1]×100

The change rate of resistance before and after driving will be smaller when the amount of change in morphology after driving is smaller. Therefore, the change rate of resistance will be nearer to zero when the amount of change in morphology is smaller.

(2) Change Rate of Half Bandwidth of Emission Spectrum Before and after Driving of Organic EL Element Each organic EL element was driven with a constant electric current of 2.5 mA/cm² at room temperature (about 23° C. to 25° C.) for 1,000 hours. The light-emission spectra of organic EL elements were respectively measured using a measuring apparatus CS-1000 (made by Konica Minolta Inc.) at the moment of before and after driving. The change rate of half bandwidth of the peak wavelength was obtained according to the following calculating formula. In Table 1, the results were described as a relative value when the change rate of half bandwidth of the peak wavelength for the organic EL element 1-1 was set to be 100.

Change rate of half bandwidth of before and after driving=[(Half bandwidth after driving/Half bandwidth before driving)−1]×100

The amount of change of light-emission spectrum before and after driving will be smaller when the amount of change in morphology after driving is smaller. Therefore, the change rate of half bandwidth will be nearer to zero when the amount of change in morphology is smaller.

TABLE 2

| Element No. | Host material | Change rate of resistance of Light-emitting layer (Relative value) | Change rate of Half bandwidth (Relative value) | Remarks |
|---|---|---|---|---|
| 1-1 | CBP | 100 | 100 | Comparative Example |
| 1-2 | m-CP | 95 | 93 | Comparative Example |
| 1-3 | H-1 | 85 | 90 | Comparative Example |
| 1-4 | H-2 | 74 | 79 | Comparative Example |
| 1-5 | B-1 | 10 | 11 | Present Invention |
| 1-6 | B-2 | 12 | 14 | Present Invention |
| 1-7 | C-1 | 17 | 15 | Present Invention |
| 1-8 | G-1 | 15 | 15 | Present Invention |
| 1-9 | B-7 | 15 | 14 | Present Invention |
| 1-10 | B-8 | 16 | 15 | Present Invention |
| 1-11 | D-1 | 23 | 24 | Present Invention |
| 1-12 | D-2 | 25 | 27 | Present Invention |
| 1-13 | B-11 | 29 | 20 | Present Invention |
| 1-14 | C-11 | 31 | 32 | Present Invention |
| 1-15 | A-11 | 32 | 35 | Present Invention |

The evaluation results listed in Table 2 demonstrated that the organic EL elements 1-5 to 1-15 of the present invention had a small change rate of resistance in the light-emitting layer and a small change rate of half bandwidth of the emission spectrum compared with the comparative examples. These results indicated that it was succeeded in obtaining an organic EL element having a small morphology change in the light-emitting layer after driving for a long period of time.

The produced organic EL elements of the present invention had a small morphology change after driving for a long period of time. It is considered that the emission lifetime was prolonged and the voltage increase after driving for a long period of time was suppressed by the effect of this small morphology change.

In order to verify the above-described supposition, the following organic EL elements were newly prepared and they were evaluated with respect to the following properties.

<Evaluation of Organic EL Elements 2-1 to 2-9>

Organic EL elements 2-1 to 2-9 were prepared in the same manner as preparation of the organic EL elements 1-1 to 1-15. That is, in the production of the organic EL element 1, the host material CBP was changed with the host materials indicated in Table 3, and the organic EL elements were prepared. Here, the organic EL elements 1-1 and 2-1 have the same constitution.

The prepared organic EL elements 2-1 to 2-9 were evaluated in the following. The non-light emitting surface of the prepared organic EL element was covered with a glass case, and a 300 μm thick glass substrate was employed as a sealing substrate. An epoxy based light curable type adhesive (LUXTRACK LC0629B produced by Toagosei Co., Ltd.) was employed in the periphery as a sealing material. The resulting one was superimposed on the aforesaid cathode to be close contact with the aforesaid transparent element substrate, and curing and sealing were carried out via exposure of UV radiation onto the glass substrate side, whereby the lighting device was formed.

Each prepared sample as described above was evaluated in the following. The evaluation results are listed in Table 3.

(1) External Quantum Efficiency

Each organic EL element was allowed to emit light with a constant electric current of 2.5 mA/cm² at room temperature (25° C.). The external quantum efficiency (77) was determined by measuring the luminance (L) (cd/m²) measured immediately after starting to emit light. Here, the measurement of luminance was done with a spectroradiometer CS-1000 (produced by Konica Minolta Inc.). The external quantum efficiency was represented by a relative value when the external quantum efficiency of the organic EL element 2-1 was set to be 100.

(2) Half Lifetime

An evaluation of half lifetime was measured according to the following method. Each organic EL element was driven with a constant electric current to give an initial luminance of 1,000 cd/m². The time for decease in one half of the initial luminance (500 cd/m²) was determined. This value was made as a scale of a half lifetime. The half lifetime was represented as a relative value when the emission lifetime of the organic EL element 2-1 was set to be 100.

(3) Voltage Increase During Drive

Each organic EL element was allowed to emit light with a constant electric current of 2.5 mA/cm² at room temperature (25° C.). The voltage of each organic EL element was measured. The voltage increase during drive was obtained according to the following calculating formula. The voltage increase during drive was represented as a relative value when the value of the organic EL element 2-1 was set to be 100.

Voltage increase during drive=Driving voltage at half luminance−Initial driving voltage When this value is smaller, it indicates that the voltage increase is small, and it is preferable.

TABLE 3

| Element No. | Host material | External quantum efficiency (Relative value) | Half lifetime (Relative value) | Voltage increase during drive (Relative value) | Remarks |
|---|---|---|---|---|---|
| 2-1 | CBP | 100 | 100 | 100 | Comparative Example |
| 2-2 | m-CP | 121 | 120 | 95 | Comparative Example |
| 2-3 | H-1 | 118 | 121 | 95 | Comparative Example |
| 2-4 | H-2 | 120 | 170 | 89 | Comparative Example |
| 2-5 | B-1 | 145 | 254 | 76 | Present Invention |
| 2-6 | B-2 | 144 | 250 | 77 | Present Invention |
| 2-7 | G-1 | 137 | 241 | 77 | Present Invention |
| 2-8 | D-1 | 133 | 230 | 77 | Present Invention |
| 2-9 | B-11 | 130 | 222 | 79 | Present Invention |

As can be seen from the evaluation results in Table 3, the organic EL elements using the organic material of the present invention had a small morphology change after driving for a long period of time. It was found that the organic EL elements of the present invention were excellent in emission efficiency and emission lifetime, and the voltage increase during driving was suppressed.

INDUSTRIAL APPLICABILITY

An organic electroluminescent element of the present invention exhibited a small degree of voltage increase, a small degree of lifetime decrease, and a small degree of light-emission efficiency decrease during drive of the organic electroluminescent element by suppressing the morphology change of the host compound during application of voltage. It can be suitably applied to a lighting device and a display device provided.

DESCRIPTION OF SYMBOLS

1: Compound having a π-π stacking structure in the molecule
2: π-π Stacking structure
3: Compound having condensed aromatic rings bonded at a trans-position in the molecule
4: Intramolecular exciplex
5: Exciplex
6: Organic EL element
7: Sealing member
8: Adhesive layer
9: Sealing material
10: Cathode
11: Organic functional layer
12: Anode
13: Element substrate
"a" and "b": Intermolecular interaction

The invention claimed is:

1. An organic electroluminescent element comprising an anode, a cathode, and an organic functional layer containing one or a plurality of light-emitting layers, the organic functional layer being interposed between the anode and the cathode, wherein at least one of the light-emitting layers contains a host compound having two condensed aromatic rings bonded to each other directly by three or more linking groups, the condensed aromatic rings form a π-π stacking structure in the molecule, each of the condensed aromatic rings has at least one structure selected from the group consisting of:

 (α-1)

 (α-2)

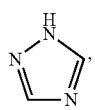 (α-3)

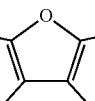 (α-4)

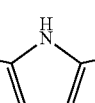 (α-5)

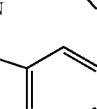 (α-6)

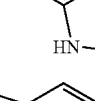 (α-7)

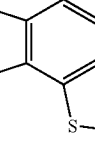 (α-8)

a carbazole ring, an azacarbazole ring, a dibenzofuran ring, an azadibenzofuran ring, a dibenzothiophene ring, an azadibenzothiophene ring, and an indoloindole ring, and wherein among linking chains of the linking groups bonding the two condensed aromatic rings, when a number of atoms in the linking chain of the linking group having the least number of atoms is defined as "n", "n" is an integer of 3 to 5 in the linking chain of the linking group bonding the two condensed aromatic rings.

2. The organic electroluminescent element described in claim 1, wherein the compound having a π-π stacking structure with the condensed aromatic rings forms an intramolecular excimer or an intramolecular exciplex.

3. The organic electroluminescent element described in claim 1,
wherein the condensed aromatic rings each have the same skeleton.

4. The organic electroluminescent element described in claim 1,
wherein the two condensed aromatic rings having the same skeleton each have the linking groups at the same position of the skeleton.

5. The organic electroluminescent element described in claim 1,
wherein the condensed aromatic rings each have a plurality of aromatic rings; and two or more of the aromatic rings each have at least one of the linking groups.

6. The organic electroluminescent element described in claim 1,
wherein two or more of the linking groups are the same linking group.

7. A display device having the organic electroluminescent element described in claim 1.

8. A lighting device having the organic electroluminescent element described in claim 1.

9. An organic electroluminescent element comprising an anode, a cathode, and an organic functional layer containing one or a plurality of light-emitting layers, the organic functional layer being interposed between the anode and the cathode,
wherein at least one of the light-emitting layers contains a light-emitting dopant and a host compound having two condensed aromatic rings bonded to each other by two or more linking groups; and the condensed aromatic rings form a π-π stacking structure in the molecule, and
wherein the two or more linking groups are selected from the group consisting of the following linking groups:

wherein the asterisk (*) in the linking groups is a site to which the condensed aromatic rings are bonded.

10. The organic electroluminescent element described in claim 1,
wherein the three or more linking groups are the same linking group.

11. The organic electroluminescent element described in claim 1,
wherein the at least one of the light-emitting layers contains the host compound as a sole host compound.

12. The organic electroluminescent element described in claim 9, wherein the at least one of the light-emitting layers contains the host compound in a volume ratio of 50% or more based on all the compounds contained in the at least one of the light-emitting layers.

13. The organic electroluminescent element described in claim 9, wherein the light-emitting dopant is at least one selected from the group consisting of phosphorescent compounds and fluorescent compounds.

14. An organic electroluminescent element comprising an anode, a cathode, and an organic functional layer containing one or a plurality of light-emitting layers, the organic functional layer being interposed between the anode and the cathode,
wherein at least one of the light-emitting layers contains a host compound having two condensed aromatic rings bonded to each other directly by three or more linking groups,
the three or more linking groups are the same linking groups,
the condensed aromatic rings form a π-π stacking structure in the molecule, and
each of the condensed aromatic rings has at least one structure selected from the group consisting of:

 (α-1)

 (α-2)

 (α-3)

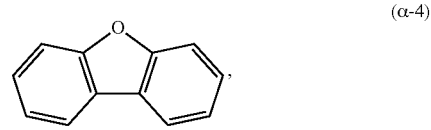 (α-4)

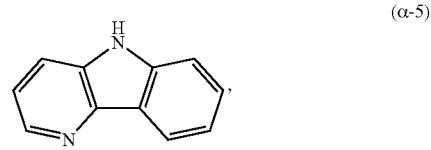 (α-5)

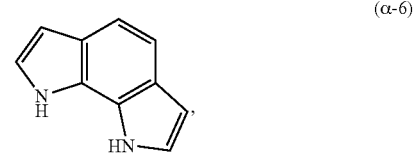 (α-6)

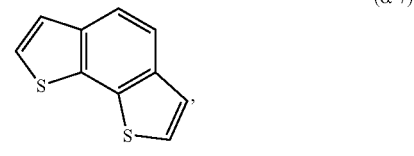 (α-7)

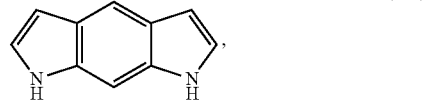 (α-8)

a carbazole ring, an azacarbazole ring, a dibenzofuran ring, an azadibenzofuran ring, a dibenzothiophene ring, an azadibenzothiophene ring, and an indoloindole ring.

15. The organic electroluminescent element described in claim 14,
wherein the compound having a π-π stacking structure with the condensed aromatic rings forms an intramolecular excimer or an intramolecular exciplex.

16. The organic electroluminescent element described in claim 14,
wherein the condensed aromatic rings each have the same skeleton.

17. The organic electroluminescent element described in claim 14,
wherein the two condensed aromatic rings having the same skeleton each have the linking groups at the same position of the skeleton.

18. The organic electroluminescent element described in claim 14,
wherein the condensed aromatic rings each have a plurality of aromatic rings; and two or more of the aromatic rings each have at least one of the linking groups.

19. The organic electroluminescent element described in claim 14,
wherein the at least one of the light-emitting layers contains the host compound as a sole host compound.

* * * * *